US009614049B2

United States Patent
Bhuwalka

(10) Patent No.: US 9,614,049 B2
(45) Date of Patent: Apr. 4, 2017

(54) FIN TUNNEL FIELD EFFECT TRANSISTOR (FET)

(71) Applicant: Taiwan Semiconductor Manufacturing Company Limited, Hsin-Chu (TW)

(72) Inventor: Krishna Bhuwalka, Leuven (BE)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 31 days.

(21) Appl. No.: 13/922,638

(22) Filed: Jun. 20, 2013

(65) Prior Publication Data

US 2014/0374799 A1    Dec. 25, 2014

(51) Int. Cl.
*H01L 29/66* (2006.01)
*H01L 29/78* (2006.01)
*H01L 31/0352* (2006.01)
*H01L 29/739* (2006.01)
*H01L 29/205* (2006.01)

(52) U.S. Cl.
CPC .. *H01L 29/66431* (2013.01); *H01L 29/66356* (2013.01); *H01L 29/7391* (2013.01); *H01L 31/0352* (2013.01); *H01L 31/035281* (2013.01); *H01L 29/205* (2013.01)

(58) Field of Classification Search
CPC ......... H01L 31/0352; H01L 31/035281; H01L 31/03529; H01L 23/3672; H01L 23/3677
USPC ...................... 257/72–77, 347, 27
See application file for complete search history.

(56) References Cited

U.S. PATENT DOCUMENTS

| | | | | |
|---|---|---|---|---|
| 6,207,977 B1 * | 3/2001 | Augusto | ......... | H01L 21/823885 257/192 |
| 8,148,718 B2 * | 4/2012 | Asbeck | ................. | H01L 29/205 257/192 |
| 2011/0147838 A1 * | 6/2011 | Gossner et al. | ............. | 257/345 |
| 2011/0193092 A1 * | 8/2011 | Passlack | ............... | B82Y 10/00 257/76 |
| 2012/0298960 A1 * | 11/2012 | Nayfeh | ............... | H01L 29/0847 257/27 |
| 2013/0037823 A1 * | 2/2013 | Kanemura | ............ | H01L 29/267 257/77 |
| 2014/0054549 A1 * | 2/2014 | Loh | ................... | H01L 29/66356 257/27 |

FOREIGN PATENT DOCUMENTS

EP    2808897 A1 *    12/2014    ....... H01L 29/66666

OTHER PUBLICATIONS

Li, et al., "AlGaSb/InAs Tunnel Field-Effect Transistor With On-Current of 78 μA/μm at 0.5 V", IEEE Electron Device Letters, vol. 33, No. 3, Mar. 2012, pp. 363-365.

* cited by examiner

*Primary Examiner* — Marc Armand
*Assistant Examiner* — Quinton Brasfield
(74) *Attorney, Agent, or Firm* — Cooper Legal Group, LLC

(57) ABSTRACT

A fin tunnel field effect transistor includes a seed region and a first type region disposed above the seed region. The first type region includes a first doping. The fin tunnel field effect transistor includes a second type region disposed above the first type region. The second type region includes a second doping that is opposite the first doping. The fin tunnel field effect transistor includes a gate insulator disposed above the second type region and a gate electrode disposed above the gate insulator. A method for forming an example fin tunnel field effect transistor is provided.

7 Claims, 29 Drawing Sheets

FIN TUNNEL FIELD EFFECT TRANSISTOR (FET)

BACKGROUND

A fin tunneling field effect transistor (FET) is a type of semiconductor device where current flows between a source region and a drain region of the device, through a channel region of the device, upon application of a sufficient voltage or bias to a gate of the device. When current flows through the channel region, the device is generally regarded as being in an 'on' state, and when current is not flowing through the channel region, the device is generally regarded as being in an 'off' state.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques, and resulting structures, for forming a fin tunnel field effect transistor (FET) are provided herein.

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
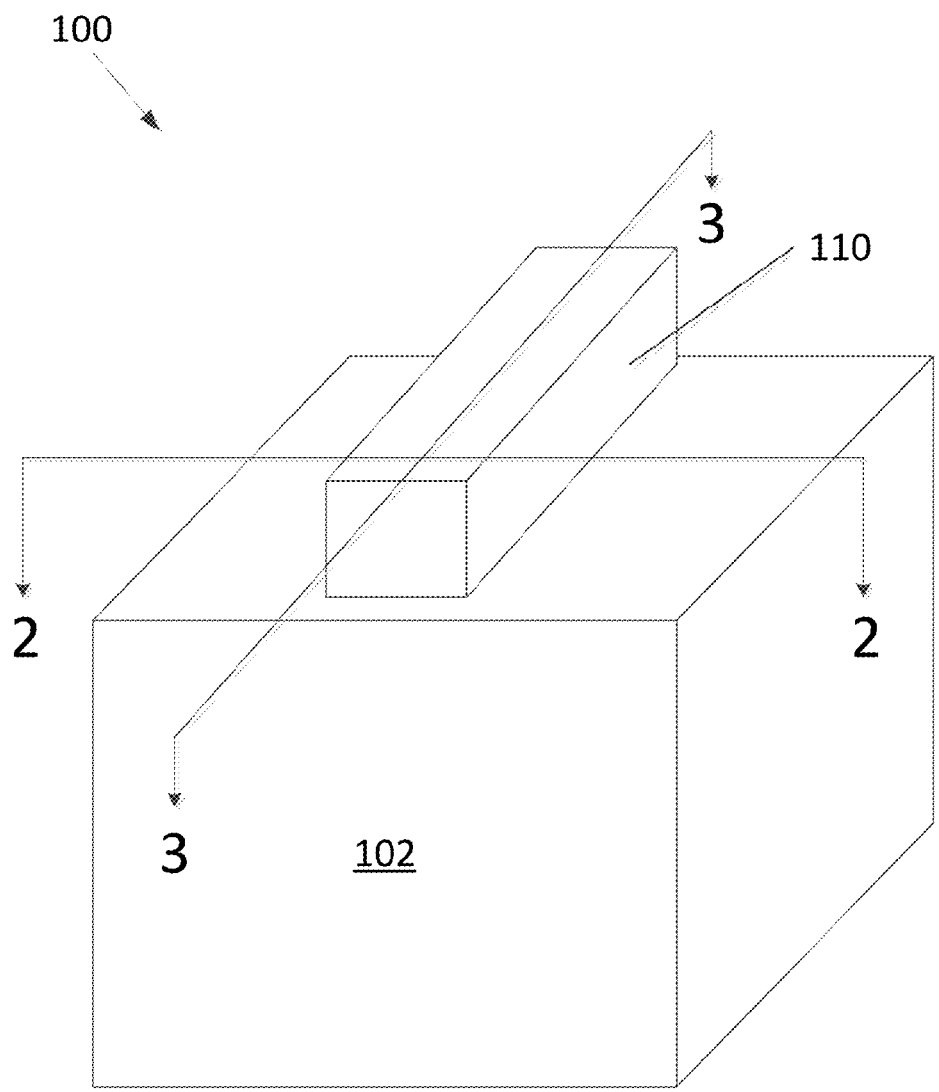
FIG. 1 illustrates a portion of a fin tunnel field effect transistor, according to an embodiment.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a fin tunnel field effect transistor (FET) and resulting structures formed thereby are provided herein.

FIG. 1 is a perspective view illustrating an example fin tunnel field effect transistor (FET) 100. In an embodiment, the fin tunnel FET is surrounded by or comprised within a shallow trench isolation (STI) region 102. The STI region 102 electrically isolates various regions and, in an example, isolates fins from other fins. The STI region 102 is formed in any number of ways, such as deposition, for example. In an embodiment, the STI region 102 is formed on a substrate, such as a semiconductor wafer (not illustrated) and comprises one or more insulator or dielectric materials, alone or in combination, such as silicon oxide, silicon nitride, silicon oxynitride, other suitable materials, etc.

Figure 2:
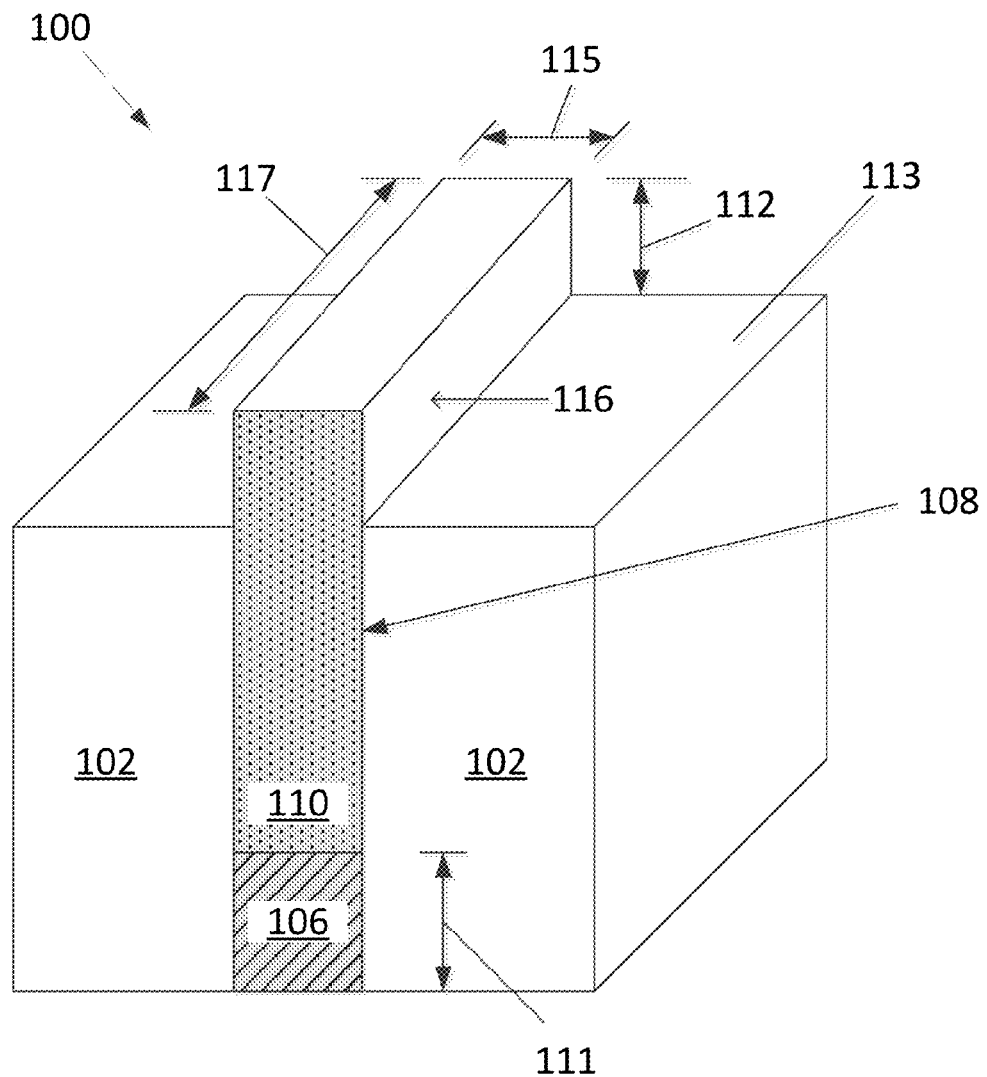
FIG. 2 illustrates a portion of a cross-sectional view of a fin tunnel field effect transistor, according to an embodiment.

FIG. 2 is a cross-sectional view illustrating the embodiment of FIG. 1 along line 2-2. In an embodiment, a portion of the STI region 102 is removed, such as by dry or wet etching, for example, to form an opening 108 within the STI region 102. It is to be appreciated that the opening 108 illustrated in FIG. 2 is filled with a seed region 106 and a first type region 110. In an embodiment, a seed material is deposited within the opening 108 on the substrate (not illustrated) and the seed region 106 is grown from the seed material. The seed region 106 includes any number of materials, including, in some embodiments, silicon (Si), gold (Au), copper (Cu), nickel alloys (Ni-alloy), alone or in combination. In an embodiment, the seed region 106 has a seed height 111 of about 10 nm to about 20 nm.

The first type region 110 is formed over the seed region 106 within the opening 108 such that the STI region 102 surrounds the first type region 110. In some embodiments, some of the STI region 102 is removed, such as by wet or dry etching, for example, so that a portion 116 of the first type region 110 extends above a top surface 113 of the STI region 102 by an extension distance 112 of about 10 nm to about 50 nm. In some embodiments, at least one of the first type region 110 or the seed region 106 has a width 115 of about 5 nm to about 50 nm. In some embodiments, the first type region 110 has a length 117 of about 100 nm to about 500 nm. The first type region 110 is formed in any number of ways, such as by deposition, for example. The first type region 110 comprises any number of materials, including, in some embodiments, gallium anitmonide (GaSb) or indium arsenide (InAs), alone or in combination.

In an embodiment, the first type region 110 is doped with a first doping. In an example, the first doping comprises a p-type impurity, such that the first type region 110 comprises a p-type material. According to some embodiments, the first doping comprises Selenium, Tellurium, Silicon, Germanium or other materials, alone or in combination. The first type region 110 is not limited to being doped with a p-type impurity, however. According to some embodiments, the first doping of the first type region 110 comprises an n-type impurity, such that the first doping of the first type region 110 comprises an n-type material. According to some embodiments, the first type region 110 comprises Beryllium, Zinc, Cadmium, Silicon, Germanium or other materials, alone or in combination. In an embodiment, the first doping of the first type region 110, either p-type or n-type, is performed vertically. According to some embodiments, the first type region 110 comprises a source region. According to some embodiments, the first type region 110 comprises a drain region.

Figure 3:
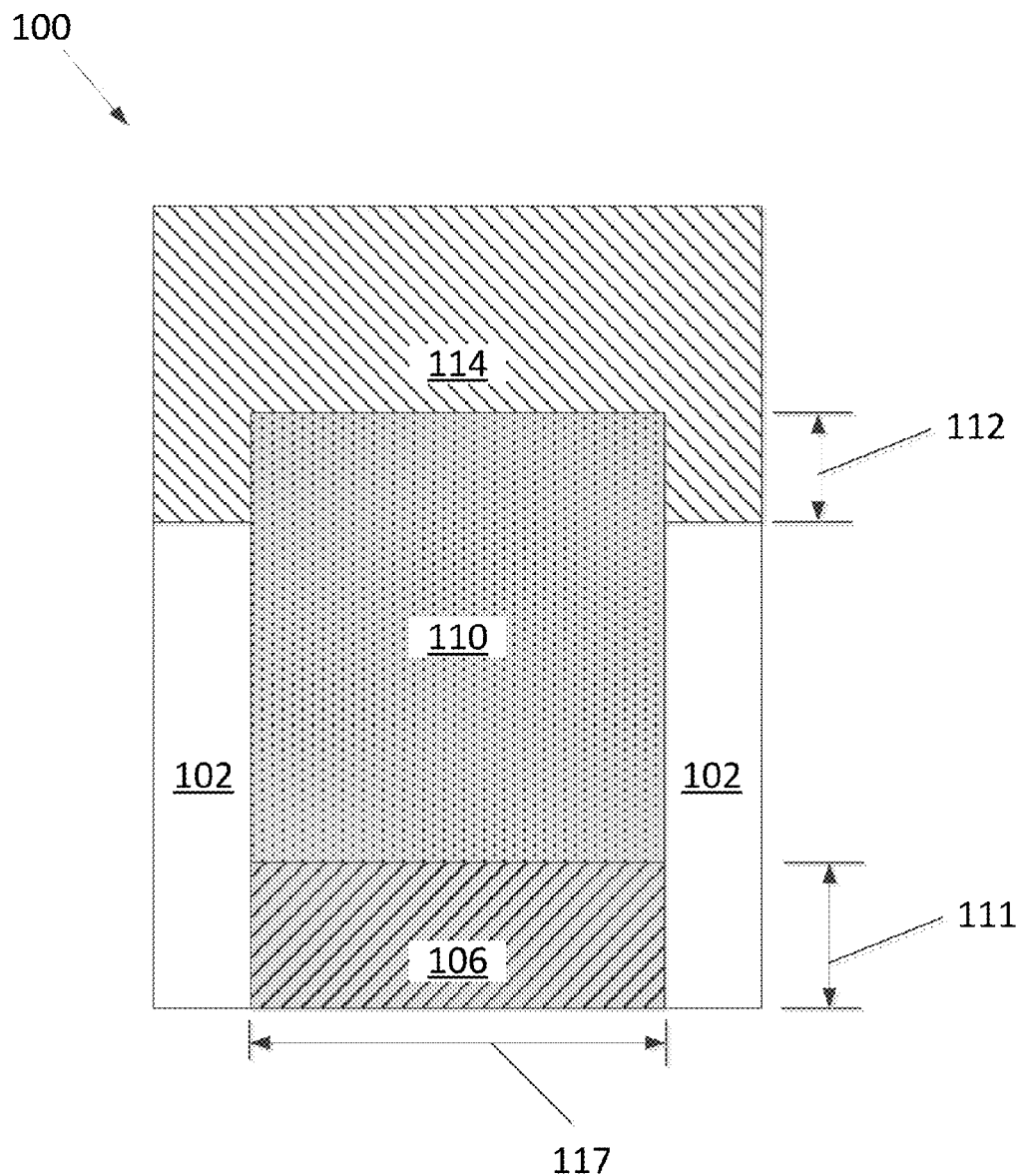
FIG. 3 illustrates masking associated with forming a fin tunnel field effect transistor, according to an embodiment.

FIG. 3 is a cross-sectional view illustrating the embodiment of FIG. 1 along line 3-3. FIG. 3 illustrates the formation of a mask layer 114 over the STI region 102 and the first type region 110. The mask layer 114 includes any number of materials, including silicon oxide, silicon nitride, etc., alone or in combination. It will be appreciated that the mask layer 114 is illustrated as extending across the entire STI region 102 in an embodiment. According to some embodiments, the mask layer 114 does not extend across the entire STI region 102, and, instead, covers the first type region 110 and merely a portion of the STI region 102.

Figure 4A:
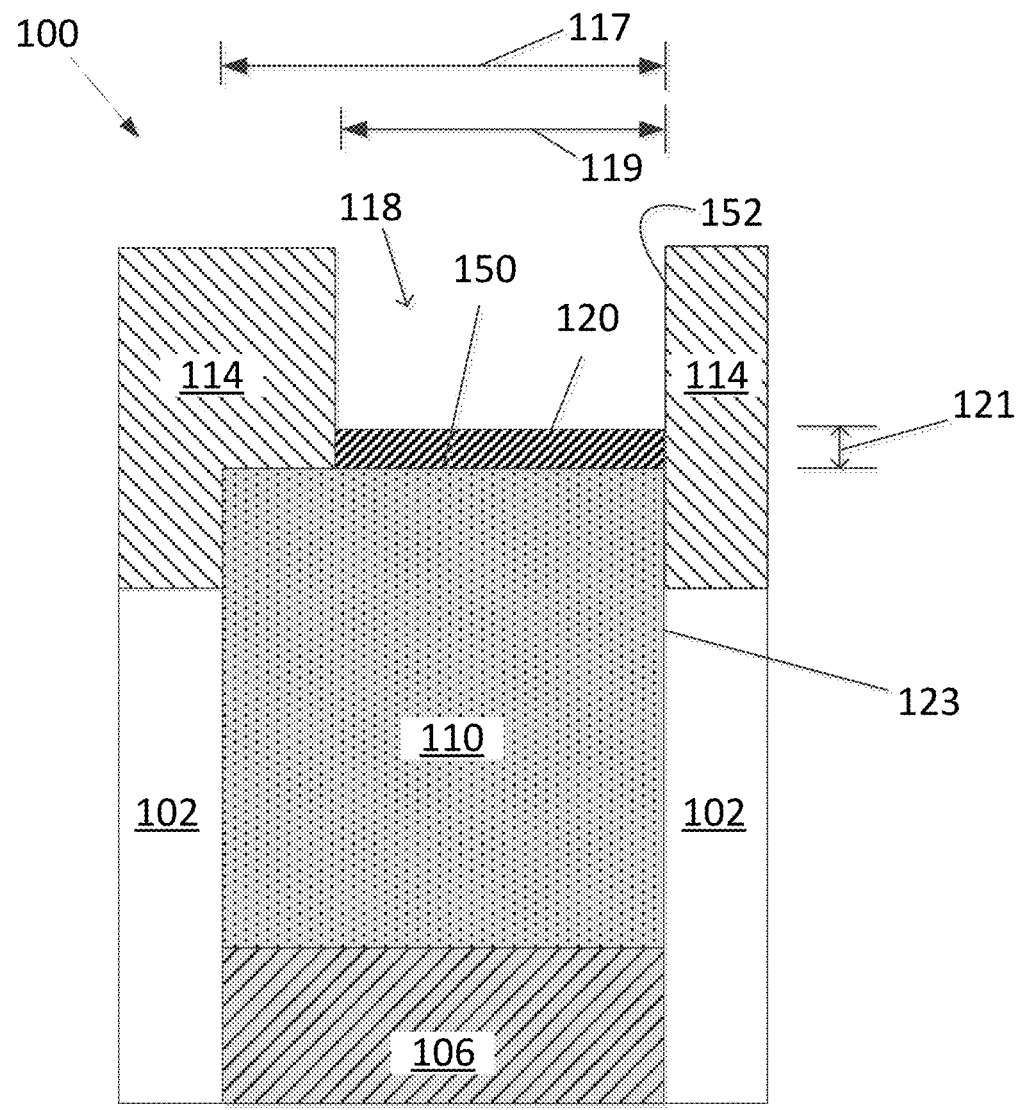
FIG. 4a illustrates a second type region associated with forming a fin tunnel field effect transistor, according to an embodiment.
Figure 4B:
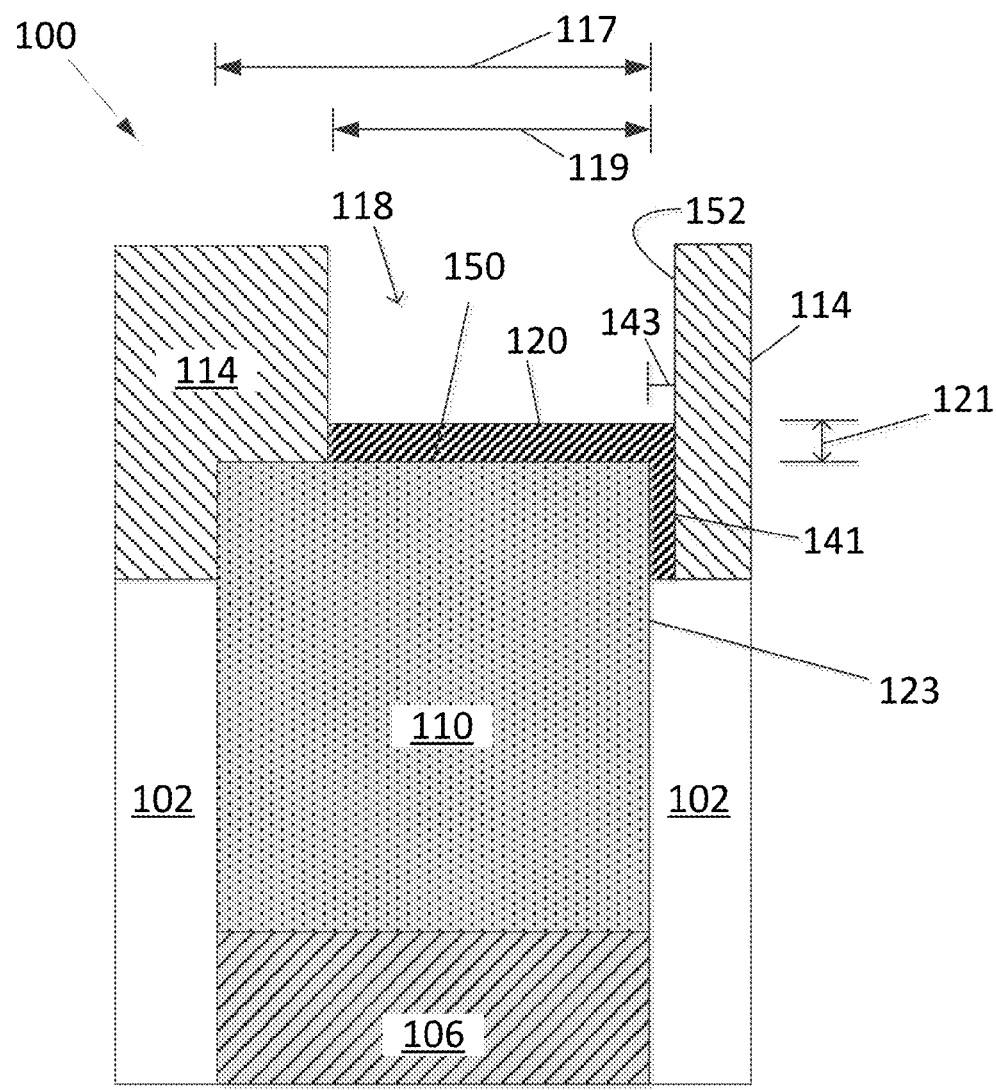
FIG. 4b illustrates a second type region associated with forming a fin tunnel field effect transistor, according to an embodiment.

Turning to FIG. 4a, in an embodiment, an opening 118 is formed in the mask layer 114, such as by etching, for example. In some embodiments, the opening 118 is formed at least partially over the first type region 110 by removing a portion of the mask layer 114. The opening 118 is formed to an upper edge or top surface 150 of the first type region 110. In the illustrated embodiment, the opening 118 is formed such that a sidewall 152 defining the opening 118 is located in line with and above a side 123 of the first type region 110. According to some embodiments, contrary to the illustrations provided in the FIGS., at least some sides, edges, etc. are not perfectly aligned with one another. In an embodiment, as illustrated in FIG. 4b, the sidewall 152 and the side 123 include an off-set portion 141 having a length 143 that is no greater than about 50 nm. In an embodiment, the opening 118 has a length 119 that is about two thirds the lengths 117 of the first type region 110.

In an embodiment, after the opening 118 is formed, a second type region 120 is formed over the first type region 110 within the opening 118. In some embodiments, the second type region 120 is formed, such as by deposition, epitaxial growth, etc., within the opening 118. In an embodiment, the second type region 120 has a second height 121 of about 2 nm to about 10 nm. In the illustrated embodiment, the second type region 120 is disposed above about two thirds of the length 117 of the first type region 110. In some embodiments, the second type region has length 119 that is about two thirds the lengths 117 of the first type region 110. According to some embodiments, the second type region has length 119 that is about three fourths the lengths 117 of the first type region 110. In an embodiment, if the first type region 110 has a length 117 of about 210 nm, then the second type region 110 has a length 119 of about 140 nm.

The second type region 120 includes any number of materials, including, in some embodiments, gallium anitmonide (GaSb), indium arsenide (InAs), or the like, alone or in combination. In some embodiments, the second type region 120 comprises a different material than the first type region 110. In an embodiment, if the first type region comprises gallium anitmonide (GaSb), then the second type region 120 comprises indium arsenide (InAs). According to some embodiments, if the first type region comprises indium arsenide (InAs), then the second type region comprises gallium anitmonide (GaSb).

In an embodiment, the second type region 120 is doped with a second doping that is opposite the first doping. In some embodiments, the second doping comprises a p-type impurity, such that the second type region 120 comprises a p-type material. In some embodiments, the second type region 120 is doped with Selenium, Tellurium, Silicon, Germanium or other materials, alone or in combination. The second type region 120 is not limited to being doped with a p-type impurity. According to some embodiments, the second type region 120 is doped with an n-type impurity, such that the second type region 120 comprises an n-type material. According to some embodiments, the second type region 120 is doped with Beryllium, Zinc, Cadmium, Silicon, Germanium or other materials, alone or in combination.

It will be appreciated that, in some embodiments, the second type region 120 comprises a second doping opposite the first doping of the first type region 110. In some embodiments, if the first type region 110 comprises a p-type material, then the second type region 120 comprises an n-type material. In some embodiments, if the first type region 110 comprises an n-type material, then the second type region comprises a p-type material. According to some embodiments, the first type region 110 comprises a source region while the second type region 120 comprises a drain region. According to some embodiments, the first type region 110 comprises the drain region while the second type region 120 comprises the source region.

Figure 5:
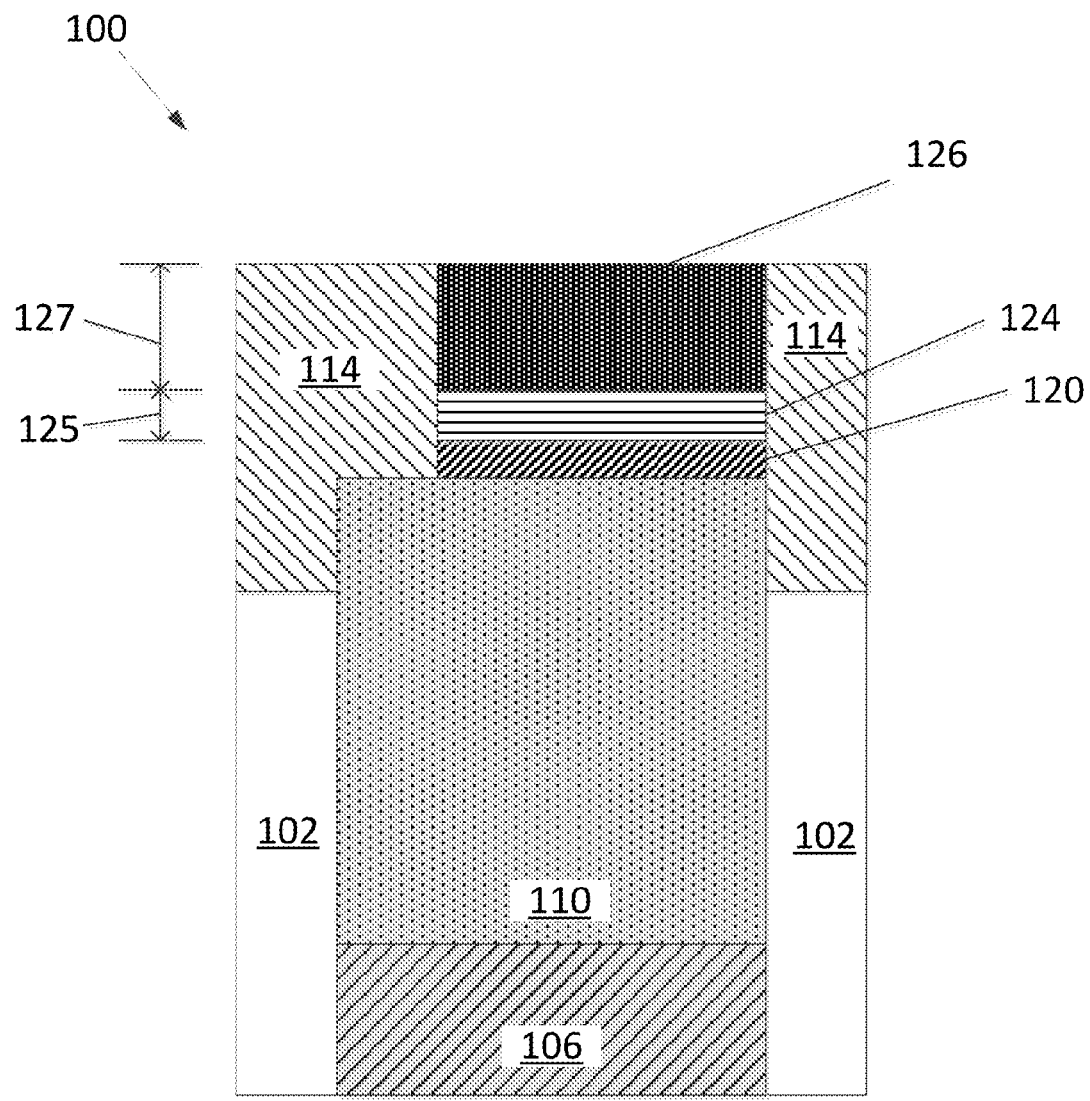
FIG. 5 illustrates a gate insulator and gate electrode associated with forming a fin tunnel field effect transistor, according to an embodiment.

FIG. 5 illustrates the formation of a gate insulator 124 and a gate electrode 126. In some embodiments, the gate insulator 124 and gate electrode 126 are formed within the opening 118. In an embodiment, the gate insulator 124 is disposed above and on top of the second type region 120 while the gate electrode 126 is disposed above and on top of the gate insulator 124. The gate insulator 124 is formed in any number of ways, such as by deposition, epitaxial growth, etc., for example. In some embodiments, the gate insulator 124 includes a dielectric material and has a height 125 of about 0.5 nm to about 5 nm. In some embodiments, the gate electrode 126 includes a conductive material, such as aluminum, copper, etc., alone or in combination. In an embodiment, the gate electrode 126 has a height 127 of about 50 nm to about 100 nm.

Figure 6:
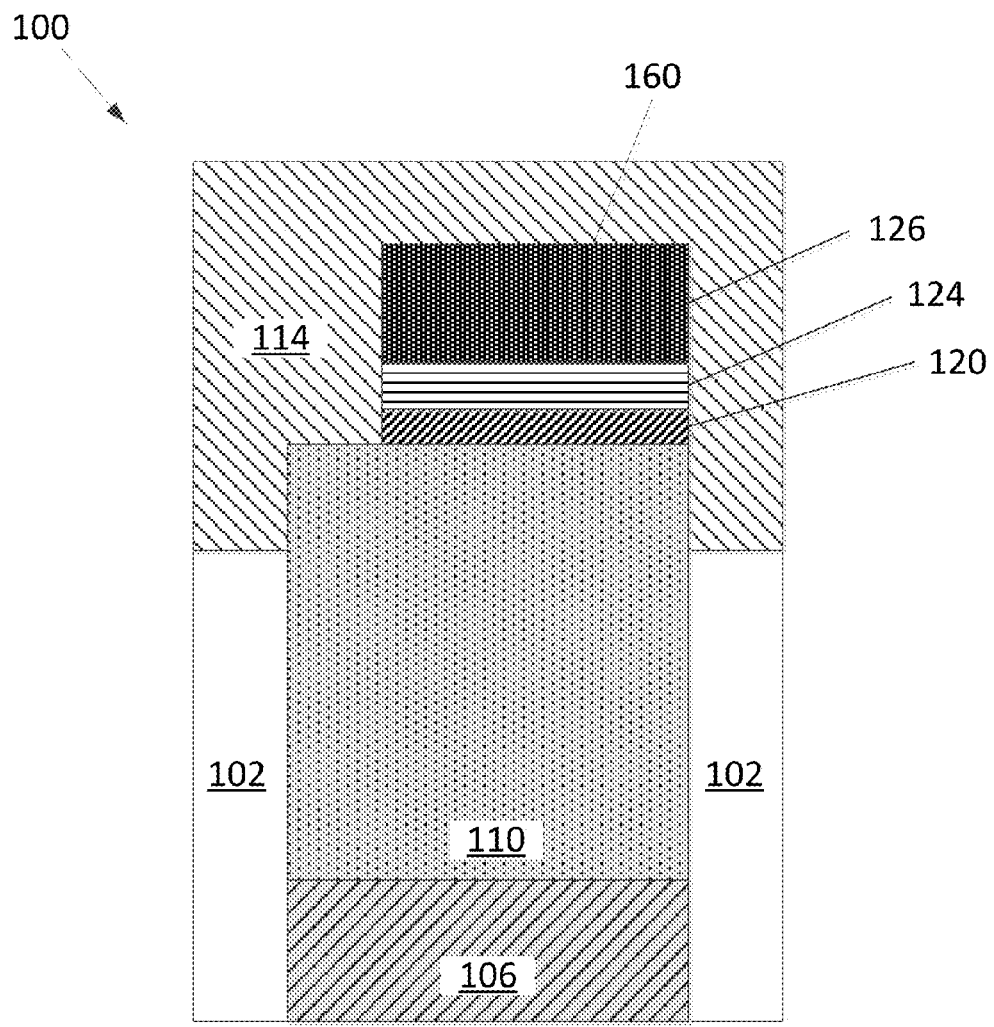
FIG. 6 illustrates masking associated with forming a fin tunnel field effect transistor, according to an embodiment.

FIG. 6 illustrates the formation of the mask layer 114, or rather additional masking material, above the gate electrode 126. In an embodiment, the mask layer 114 is formed on top of an upper surface 160 of the gate electrode 126. In some embodiments, the mask layer 114 extends across the upper surface 160 of the gate electrode 126 so as to cover the gate electrode 126.

Figure 7:
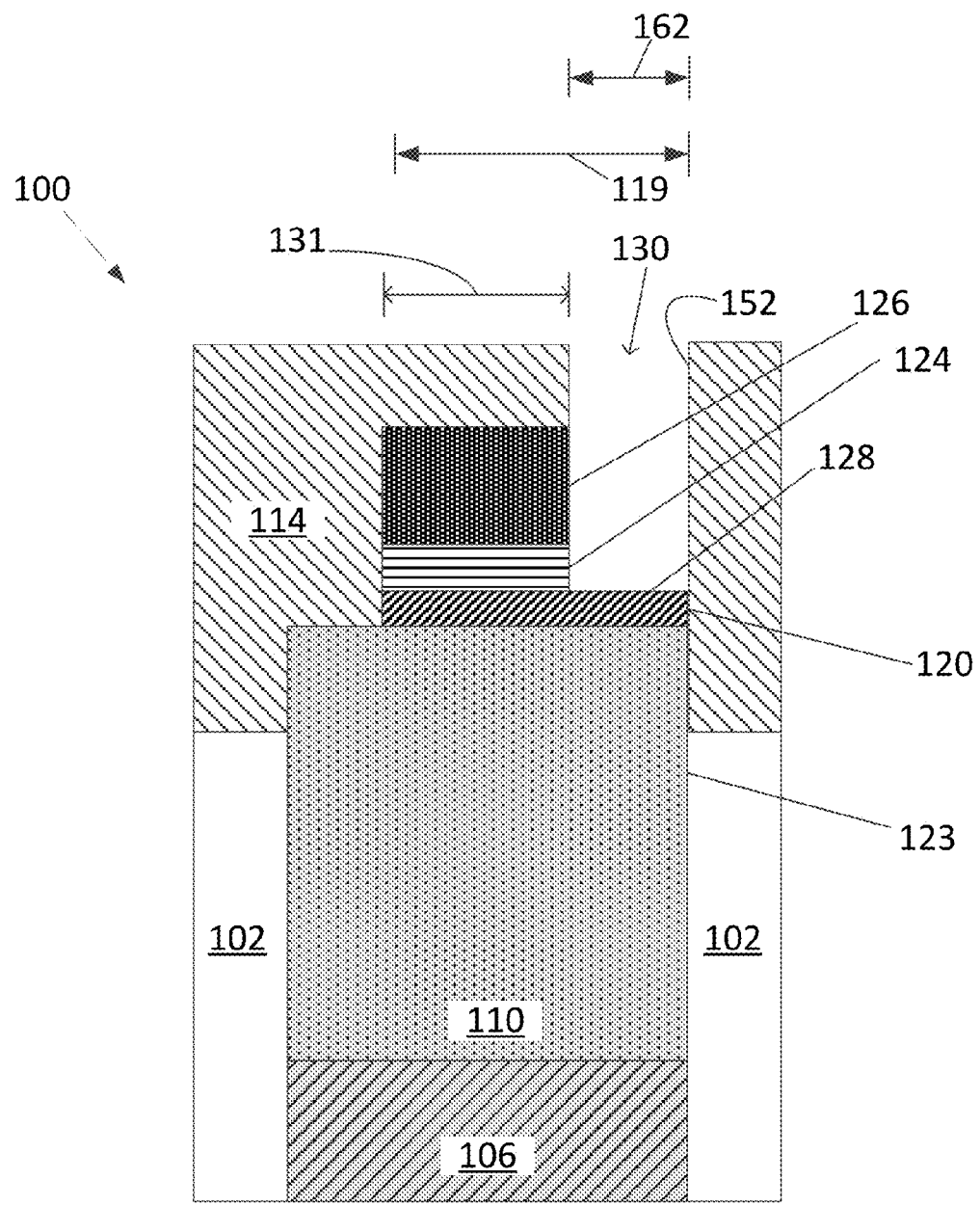
FIG. 7 illustrates forming an opening associated with forming a fin tunnel field effect transistor, according to an embodiment.

FIG. 7 illustrates the formation of a second opening 130. In an embodiment, the second opening 130 is formed in the mask layer 114, gate insulator 124, and gate electrode 126, such as by etching, for example. In some embodiments, the second opening 130 is formed at least partially over the second type region 120 by removing a portion of the mask layer 114, gate insulator 124, and gate electrode 126. In an embodiment, the second opening 130 is formed to an upper edge or top surface 128 of the second type region 120. In an embodiment, the second opening 130 is formed such that the sidewall 152 defining the second opening 130 is located in line with and above the side 123 of the first type region 110. In an embodiment, as illustrated in FIG. 4b, the sidewall 152 and the side 123 include the off-set portion 141 having length 143 that is no greater than about 50 nm. In some embodiments, the second opening 130 is bound on one side by the sidewall 152 and on an opposing side by the gate insulator 124, gate electrode 126, and the mask layer 114. In an embodiment, after the second opening 130 is formed, the gate insulator 124 and gate electrode 126 include a gate length 131 of about 10 nm to about 100 nm. In an embodiment, the second opening 130 comprises a length 162 that is about one third the length 119 of the second type region 120, with the gate insulator 124 and gate electrode 126 comprising about the other two thirds of the length of the second type region 120.

Figure 8:
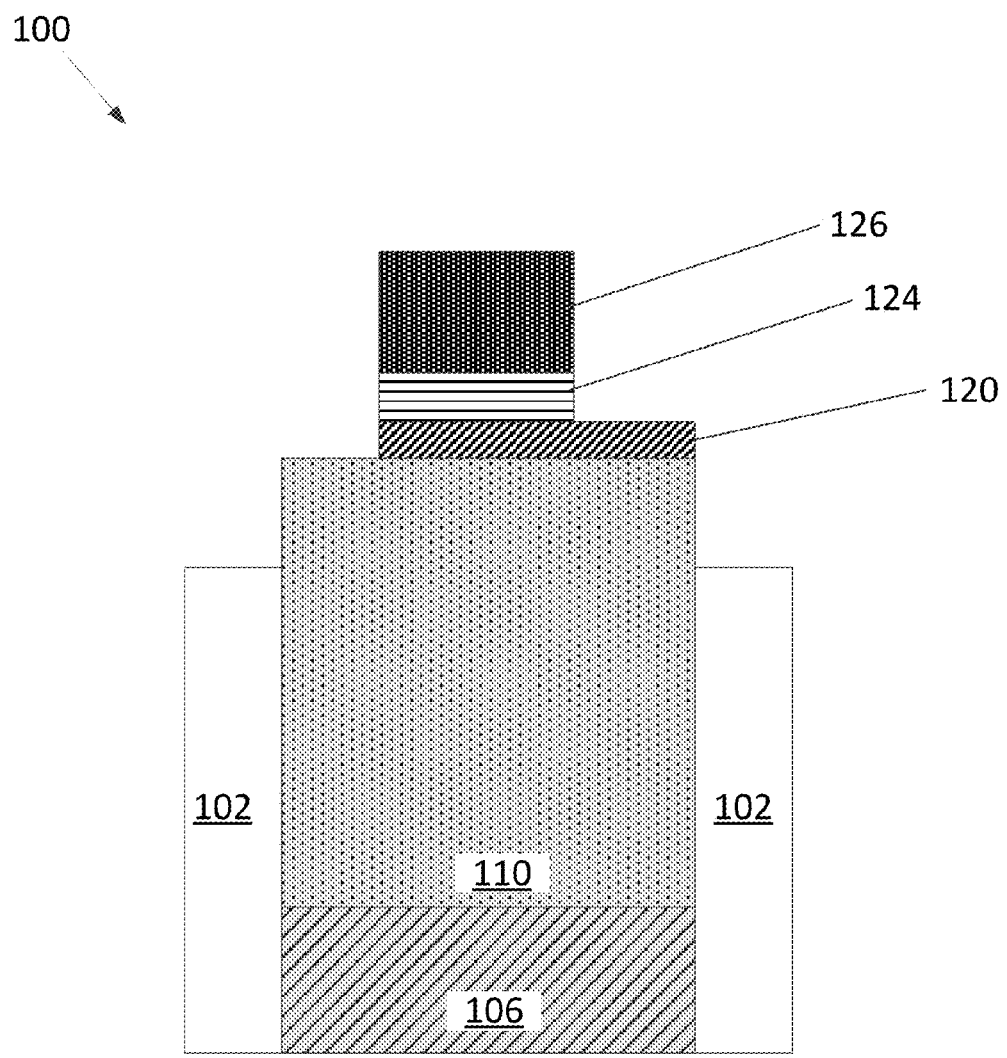
FIG. 8 illustrates removing a mask region associated with forming a fin tunnel field effect transistor, according to an embodiment.

FIG. 8 illustrates the removal of the mask layer 114 after the second opening 130 is formed. The mask layer 114 is removed in any number of ways, such as by etching, for example.

Figure 9:
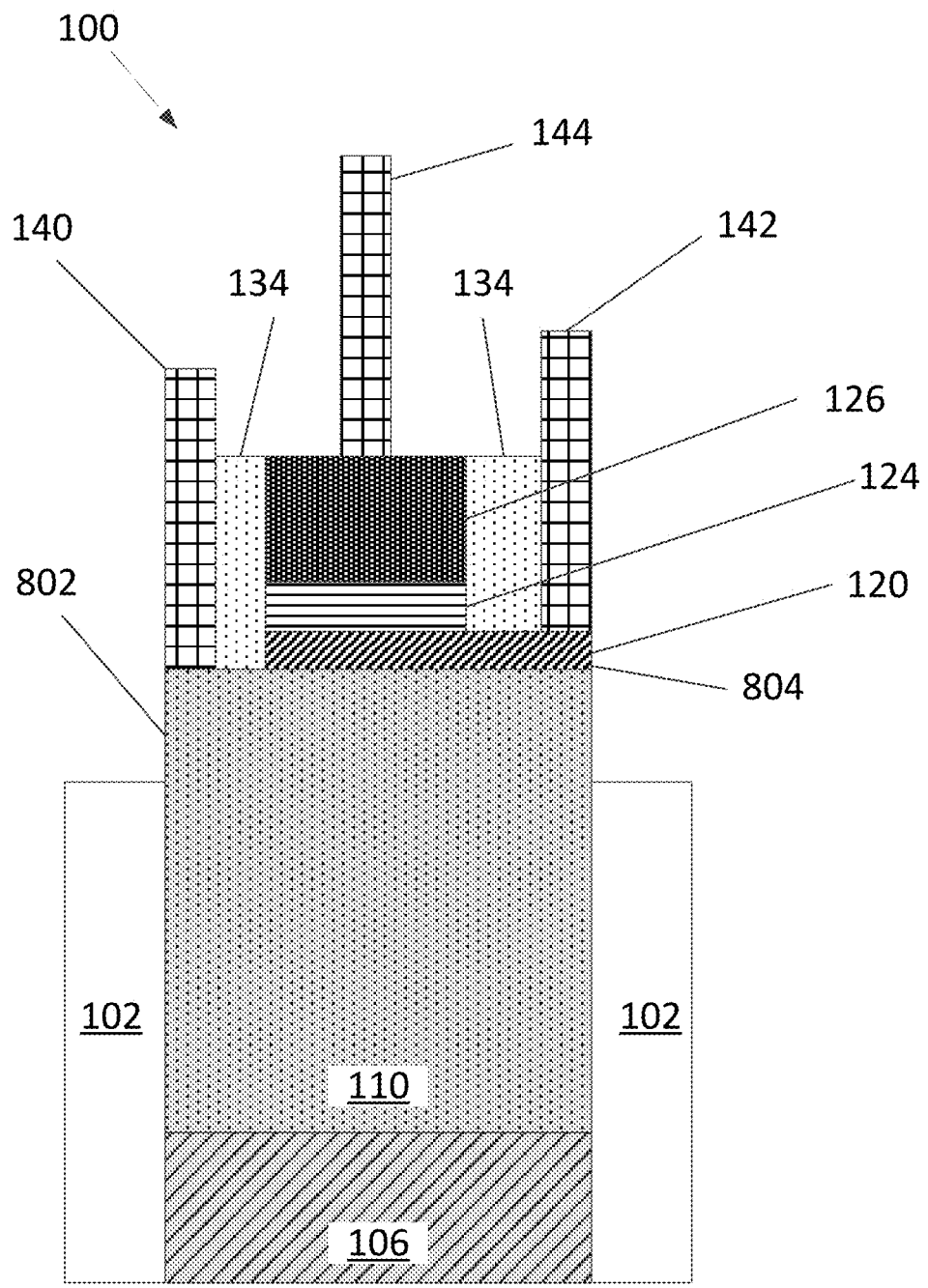
FIG. 9 illustrates a fin tunnel field effect transistor, according to an embodiment.

FIG. 9 is a cross-sectional view illustrating an example of the fin tunnel FET 100. In an embodiment, spacers 134 are formed, such as by deposition and patterning, for example. According to some embodiments, a dielectric material (not illustrated) is patterned to form a plurality of openings for a source contact 140, drain contact 142, and gate contact 144. In an embodiment, the source contact 140, drain contact 142, and gate contact 144 comprise a conductive material. In some embodiments, the source contact 140 is formed in contact with the first type region 110, the drain contact 142 is formed in contact with the second type region 120, and the gate contact 144 is formed in contact with the gate electrode 126.

In some embodiments, the first type region 110 comprises gallium anitmonide (GaSb) and is doped with a p-type impurity. In some embodiments, the second type region 120 comprises indium arsenide (InAs) and is doped with an n-type impurity. According to some embodiments, the first type region 110 comprises a source region 802 while the second type region 120 comprises a drain region 804. According to some embodiments, when a voltage ($V_g$) is applied to the gate contact 144, current will flow from the source contact 140, through the first type region 110, through the second type region 120, and to the drain contact 142.

Figure 10:
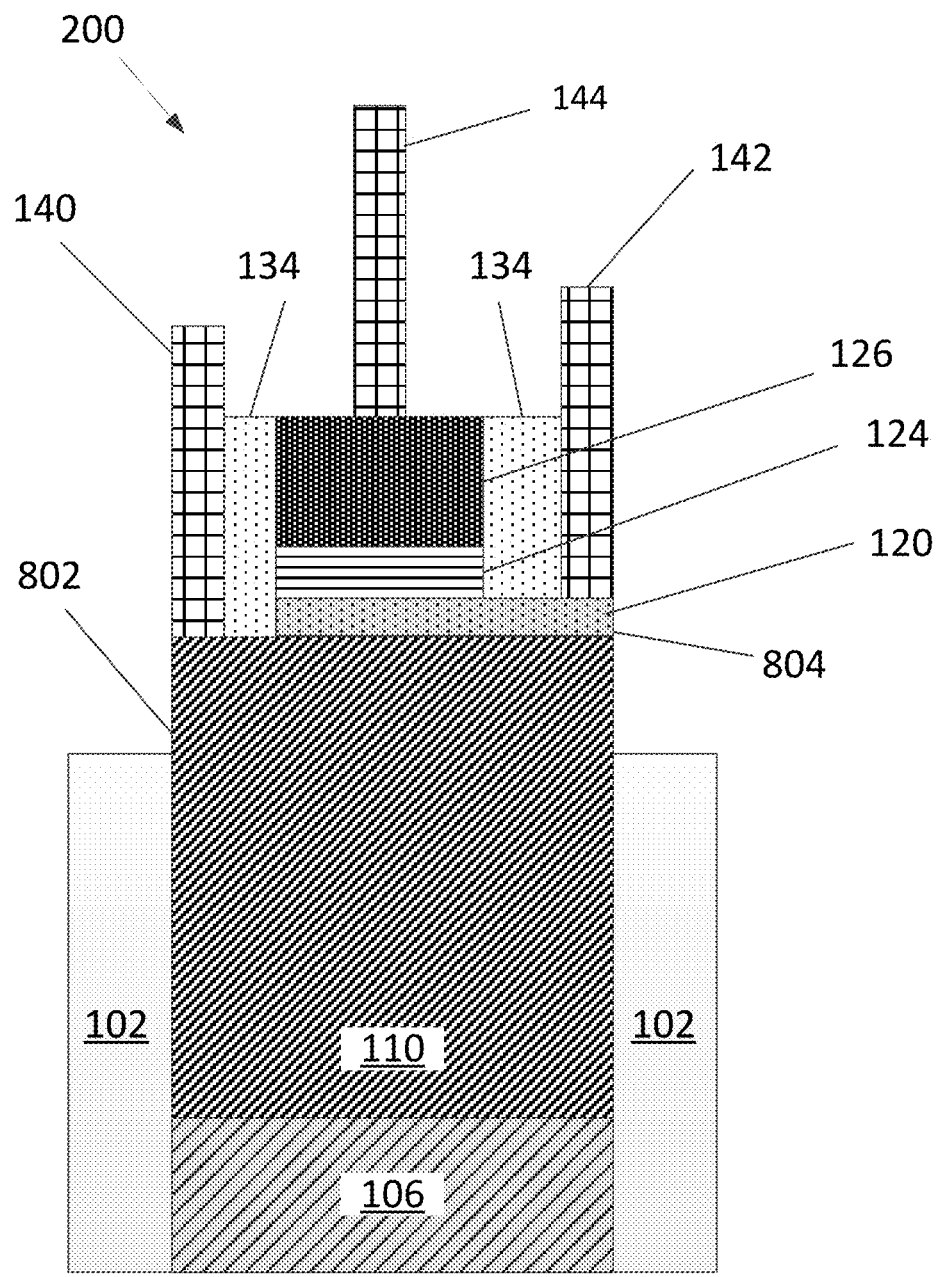
FIG. 10 illustrates a fin tunnel field effect transistor, according to an embodiment.

FIG. 10 is a cross-sectional view illustrating a second example fin tunnel FET 200. According to some embodiments, the second fin tunnel FET 200 includes the STI region 102, the seed region 106, the first type region 110, the second type region 120, the gate insulator 124, the gate electrode 126, the source contact 140, the drain contact 142, and the gate contact 144.

In an embodiment, the second fin tunnel FET 200 comprises a p-type FET. In some embodiments, the first type region 110 of the second fin tunnel FET 200 comprises indium arsenide (InAs) and is doped with an n-type impurity such that the first type region 110 comprises an n-type material. In some embodiments, the second type region 120 of the second fin tunnel FET 200 comprises gallium anitmonide (GaSb) and is doped with a p-type impurity such that the second type region 120 comprises a p-type material. In some embodiments, the first type region 110 comprises the source region 802 while the second type region 120 comprises the drain region 804. According to some embodiments, a negative bias is applied to the gate contact 144 and to the drain contact 142 while the source contact 140 is grounded. Electron holes will flow from the source contact 140, through the first type region 110, through the second type region 120, and to the drain contact 142.

Figure 11:
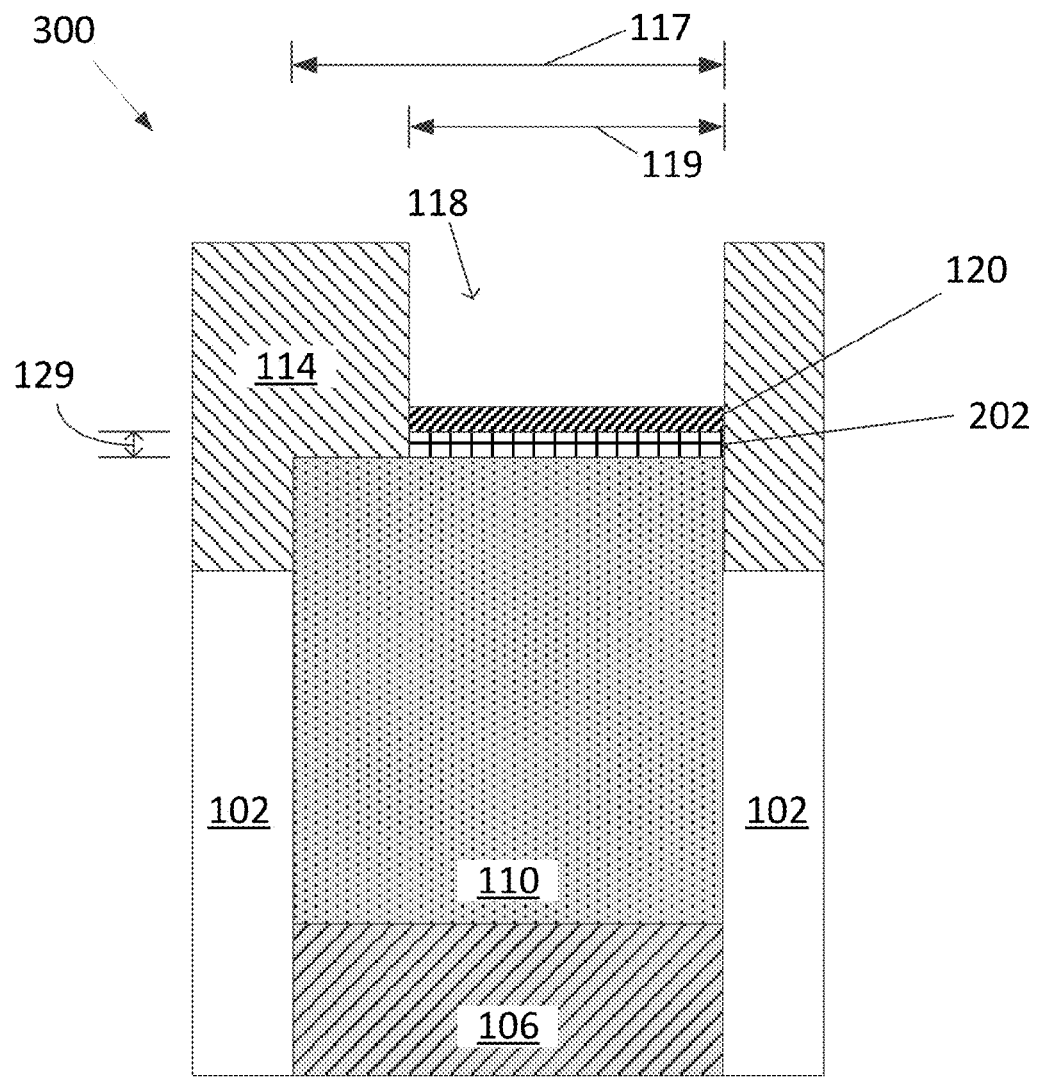
FIG. 11 illustrates forming a barrier region and second type region associated with forming a fin tunnel field effect transistor, according to an embodiment.

FIG. 11 is a cross-sectional view illustrating a third example fin tunnel FET 300. In some embodiments, after the opening 118 is formed in the mask layer 114, a barrier region 202 is formed over the first type region 110 within the opening 118. According to some embodiments, the barrier region 202 is formed by deposition, epitaxial growth, etc., for example. In an embodiment, the barrier region 202 has a height 129 of about 1 nm to about 5 nm. According to some embodiments, the barrier region 202 comprises aluminum gallium antimonide ($AlGa_xSb_{1-x}$), aluminum arsenide antimonide ($AlAs_xSb_{1-x}$) or other materials, alone or in combination. In an embodiment, the composition (x) of AlGaSb or AlAsSb is from 0 to 1, and is chosen so as to be lattice-matched to the underlying material, such as in this case InAs or GaSb.

In some embodiments, the second type region 120 is formed over the barrier region 202 such that the barrier region 202 is disposed above the first type region 110 and below the second type region 120. In some embodiments, the second type region 120 and barrier region 202 have the length 119 that is about two thirds of the length 117 of the first type region 110. In some embodiments, the length 119 of the barrier region 202 is about 140 nm, for example.

Figure 12:
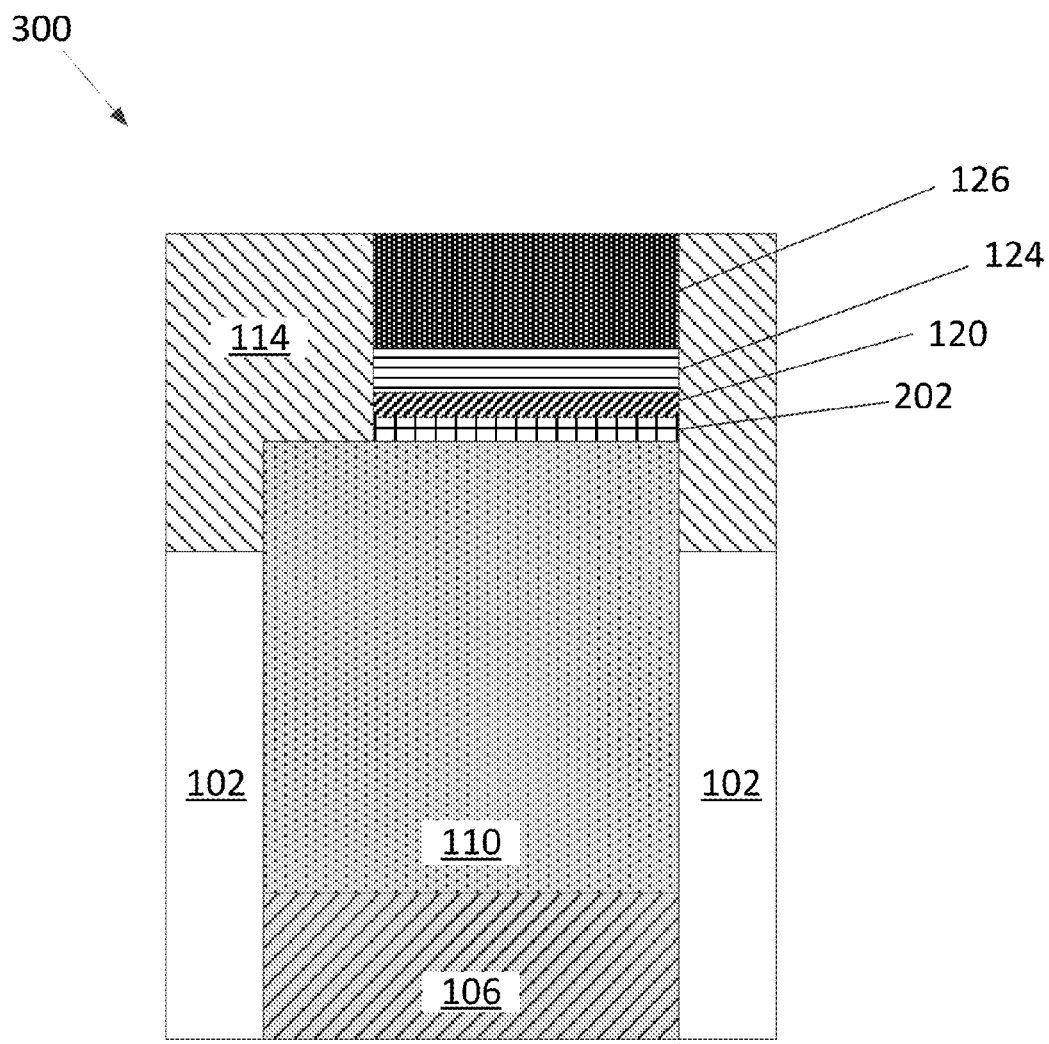
FIG. 12 illustrates a gate insulator and gate electrode associated with forming a fin tunnel field effect transistor, according to an embodiment.

FIG. 12 illustrates the formation of the gate insulator 124 and gate electrode 126 within the opening 118. In some embodiments, the gate insulator 124 is disposed above and on top of the second type region 120 while the gate electrode 126 is disposed above and on top of the gate insulator 124.

Figure 13:
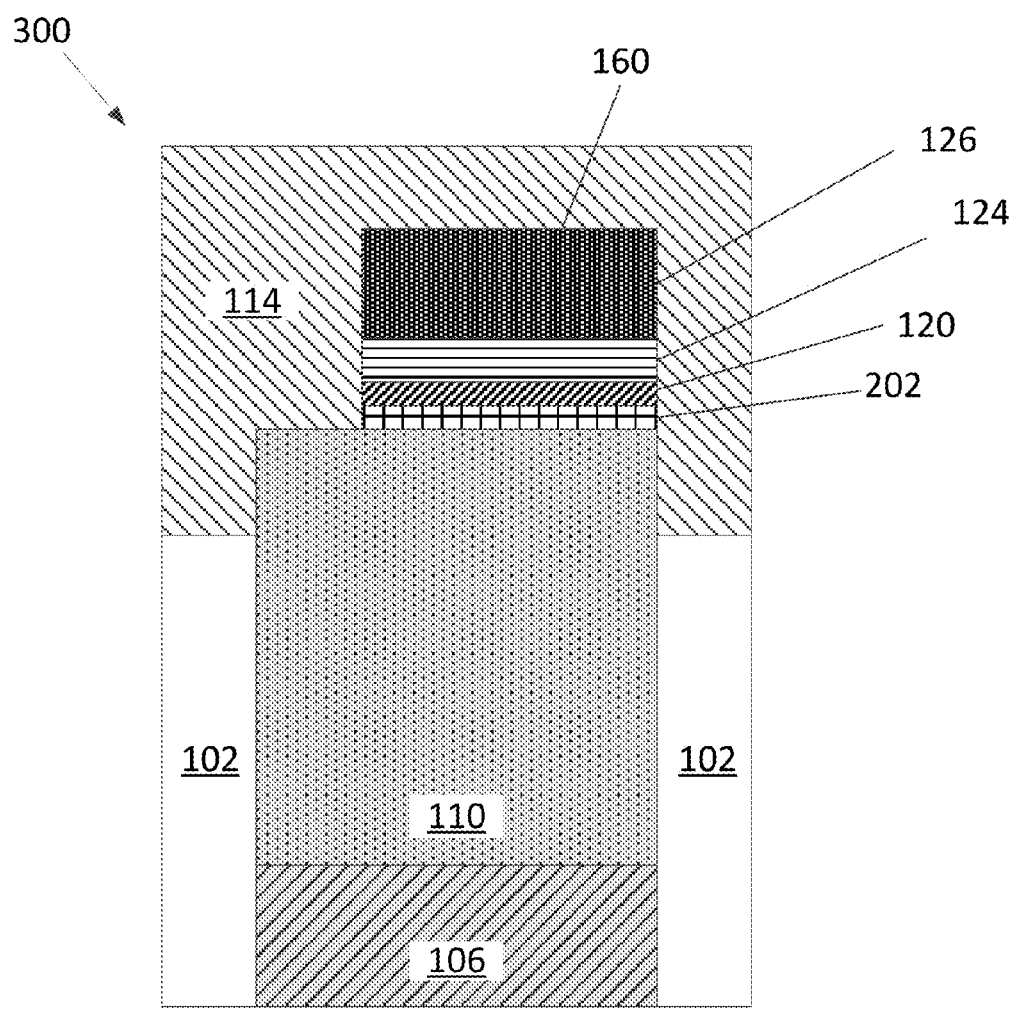
FIG. 13 illustrates masking associated with forming a fin tunnel field effect transistor, according to an embodiment.

FIG. 13 illustrates the formation of the mask layer 114 above the gate electrode 126. According to some embodiments, the mask layer 114 is deposited above the gate electrode 126 and extends across the upper surface 160 of the gate electrode 126 so as to cover the gate electrode 126.

Figure 14:
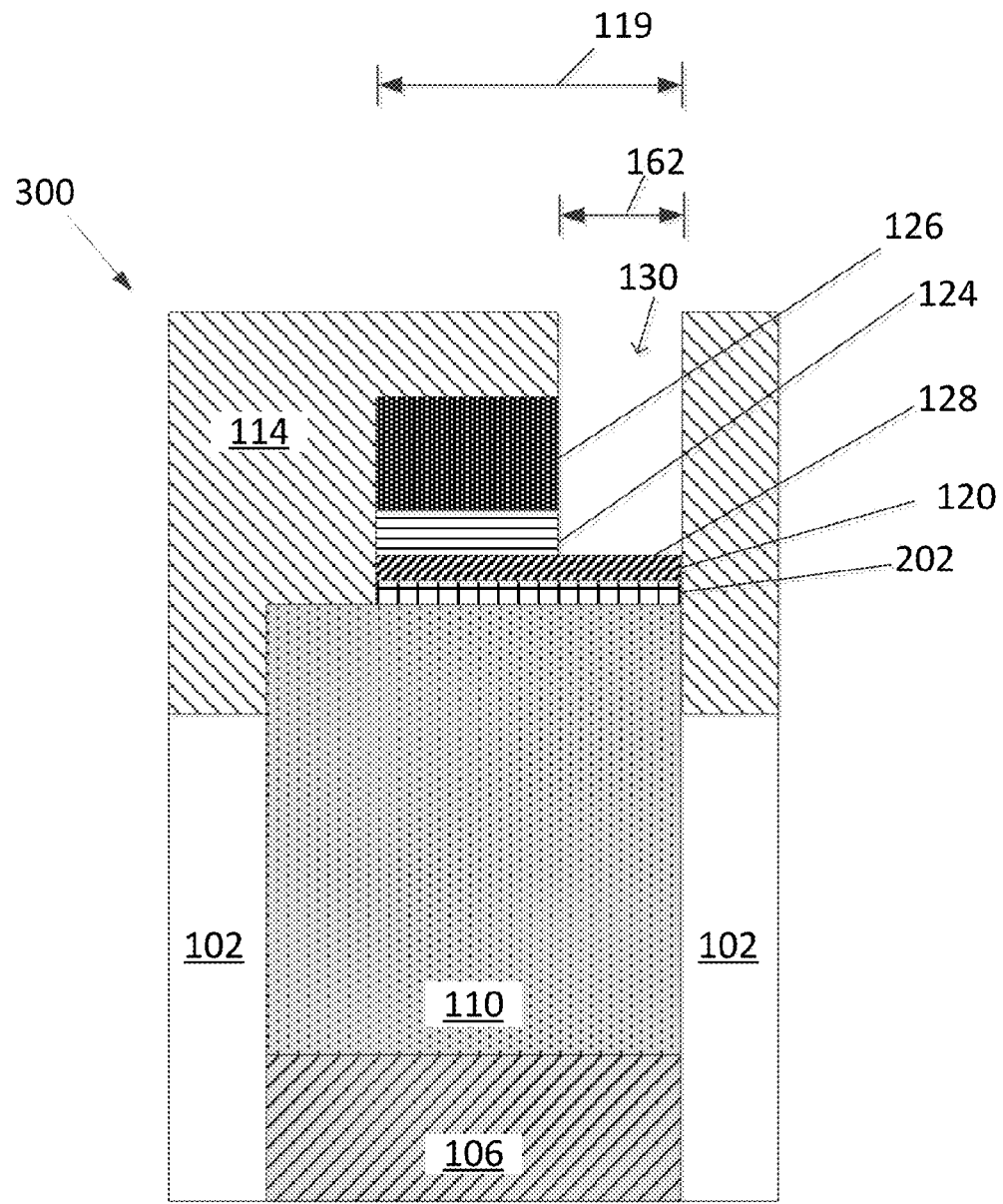
FIG. 14 illustrates forming an opening associated with forming a fin tunnel field effect transistor, according to an embodiment.

FIG. 14 illustrates the formation of the second opening 130. In an embodiment, the second opening 130 is formed in the mask layer 114, gate insulator 124, and gate electrode 126, such as by etching, for example. In some embodiments, the second opening 130 is formed at least partially over the second type region 120 by removing a portion of the mask layer 114, gate insulator 124, and gate electrode 126. In an embodiment, the second opening 130 is formed to the top surface 128 of the second type region 120. In some embodiments, the second opening 130 has the length 162 that is about one third the length 119 of the second type region 120, with the gate insulator 124 and gate electrode 126 comprising about the other two thirds of the length 119 of the second type region 120.

Figure 15:
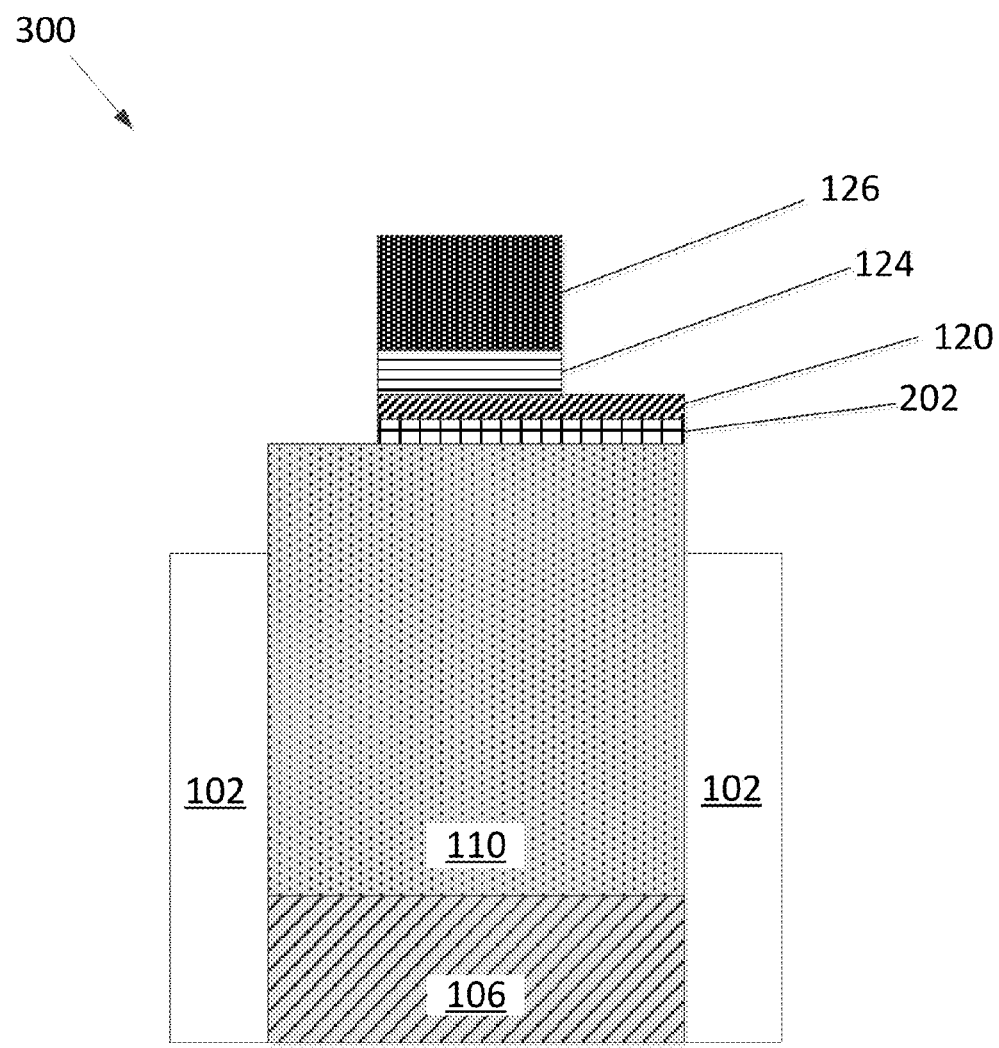
FIG. 15 illustrates removing a mask region associated with forming a fin tunnel field effect transistor, according to an embodiment.

FIG. 15 illustrates the removal of the mask layer 114 after the second opening 130 is formed. The mask layer 114 is removed in any number of ways, such as by etching, for example.

Figure 16:
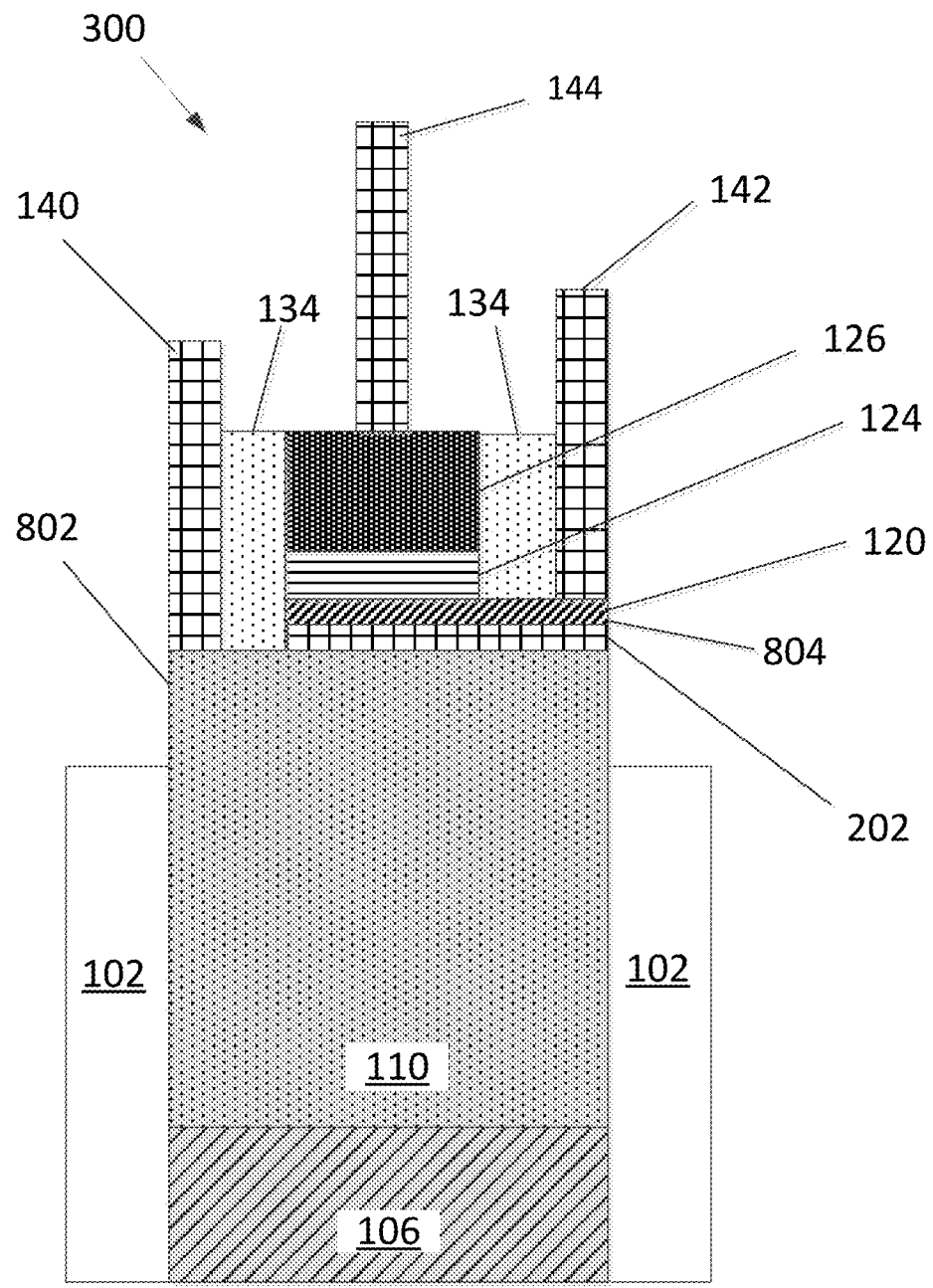
FIG. 16 illustrates a fin tunnel field effect transistor, according to an embodiment.

FIG. 16 is a cross-sectional view illustrating an example of the third fin tunnel FET 300. In an embodiment, the third fin tunnel FET 300 includes the spacers 134, the source contact 140, drain contact 142, and gate contact 144. In some embodiments, the source contact 140 is formed in contact with the first type region 110, the drain contact 142 is formed in contact with the second type region 120, and the gate contact 144 is formed in contact with the gate electrode 126.

In some embodiments, the third fin tunnel FET 300 comprises an n-type FET. In an embodiment, the first type region 110 of the third fin tunnel FET 300 comprises gallium anitmonide (GaSb) and is doped with a p-type impurity such that the first type region 110 comprises a p-type material. In an embodiment, the second type region 120 of the third fin tunnel FET 300 comprises indium arsenide (InAs) and is doped with an n-type impurity, such that the second type region 120 comprises an n-type material. In some embodiments, the first type region 110 comprises a source region 802 while the second type region 120 comprises a drain region 804. According to some embodiments, when a voltage ($V_g$) is applied to the gate contact 144, current will flow from the source contact 140, through the first type region 110, through the second type region 120, and to the drain contact 142. In some embodiments, due, at least in part, to the presence of the barrier region 202, leakage current between the first type region 110 and the second type region 120 is inhibited, such as when voltage is not applied to the gate contact 144.

Figure 17:
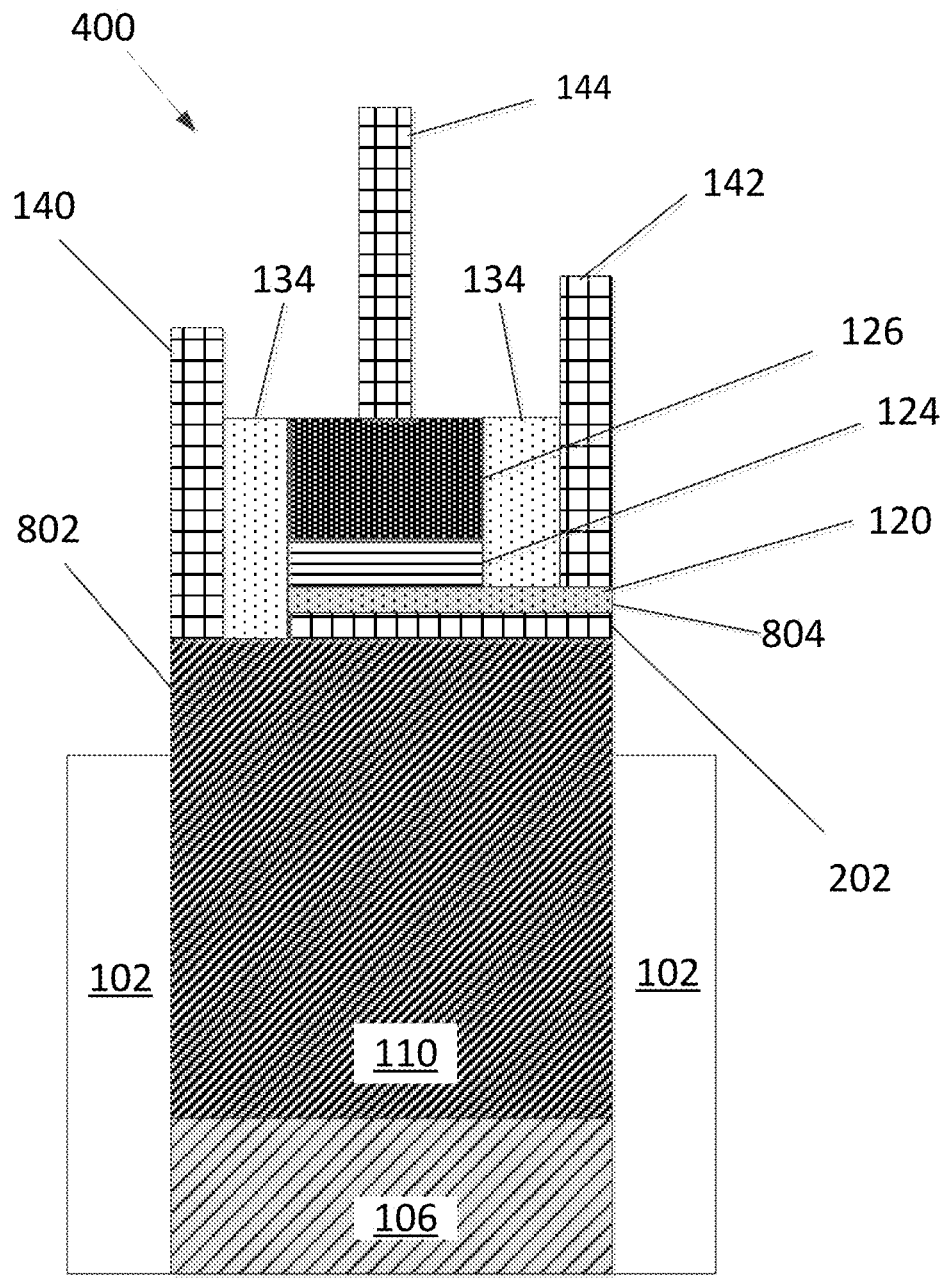
FIG. 17 illustrates a fin tunnel field effect transistor, according to an embodiment.

FIG. 17 illustrates a fourth example fin tunnel FET 400. According to some embodiments, the fourth fin tunnel FET 400 includes the STI region 102, the seed region 106, the first type region 110, the second type region 120, the gate insulator 124, the gate electrode 126, the source contact 140, the drain contact 142, the gate contact 144, and the barrier region 202.

In an embodiment, the fourth fin tunnel FET 400 comprises a p-type FET. According to some embodiments, the first type region 110 of the fourth fin tunnel FET 400 comprises indium arsenide (InAs) and is doped with an n-type impurity such that the first type region 110 comprises an n-type material. In some embodiments, the second type region 120 of the fourth fin tunnel FET 400 comprises gallium anitmonide (GaSb) and is doped with a p-type impurity, such that second type region 120 comprises a p-type material.

In an embodiment, a negative bias is applied to the gate contact 144 and to the drain contact 142 while the source contact 140 is grounded. According to some embodiments, electron holes will flow from the source contact 140, through the first type region 110, through the second type region 120, and to the drain contact 142. In some embodiments, due, at least in part, to the presence of the barrier region 202, leakage current between the first type region 110 and the second type region 120 is inhibited, such as when bias is not applied to the gate contact 144.

Figure 18:
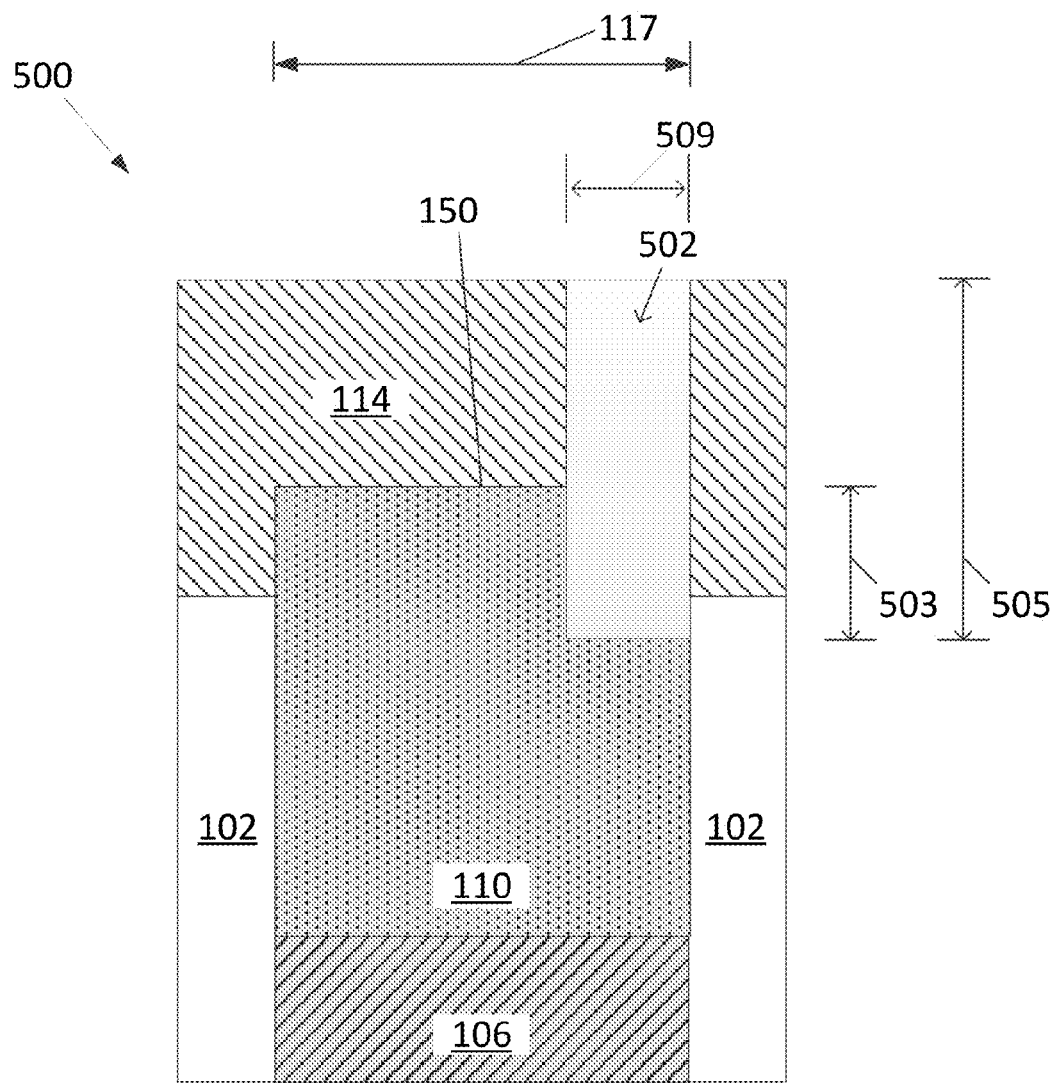
FIG. 18 illustrates forming an opening associated with forming a fin tunnel field effect transistor, according to an embodiment.

FIG. 18 illustrates a fifth example fin tunnel FET 500. In some embodiments, a third opening 502 is formed in the mask layer 114, with the third opening 502 extending through a portion of the mask layer and at least partially into the first type region 110. The third opening 502 is formed in any number of ways, such as by etching, for example. In an embodiment, the third opening 502 extends to a depth (e.g., thickness 503) of about 5 nm to about 20 nm from the top surface 150 of the first type region 110 into the first type region 110. In some embodiments, the third opening 502 has a total depth 505 of about 50 nm to about 125 nm. In the illustrated embodiment, the third opening 502 has a length 509 that is less than the length 117 of the first type region 110, such that the third opening 502 extends along a portion (e.g., less than all) of the first type region 110.

Figure 19:
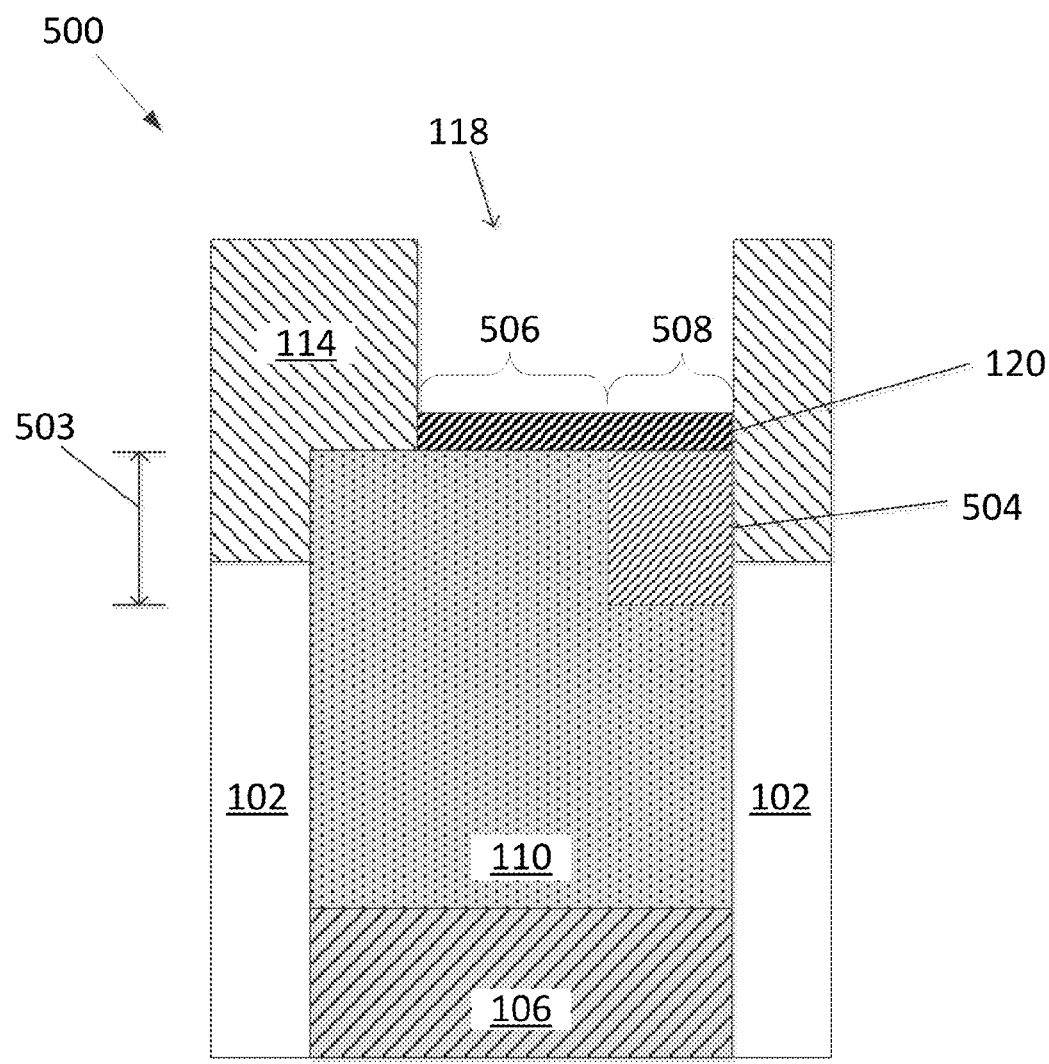
FIG. 19 illustrates forming a barrier region and second type region associated with forming a fin tunnel field effect transistor, according to an embodiment.

FIG. 19 illustrates the formation of a second barrier region 504. In an embodiment, the second barrier region 504 is formed above at least some of the first type region 110 within the third opening 502. In some embodiments, the second barrier region 504 is formed by deposition, epitaxial growth, etc., within the third opening 502. The second barrier region 504 comprises a thickness 503 of about 5 nm to about 20 nm. In an embodiment, the second barrier region 504 comprises aluminum gallium antimonide (AlGa$_x$Sb$_{1-x}$), aluminum arsenide antimonide (AlAs$_x$Sb$_{1-x}$) or other materials, alone or in combination. In some embodiments, the composition x is from 0 to 1 which is chosen so as to be lattice-matched to the underlying material, such as InAs or GaSb. According to some embodiments, at least some of the mask layer 114 is removed, such as by etching, to form opening 118, and the second type region 120 is formed over the second barrier region 504. In an embodiment, the second barrier region 504 is disposed above at least some of the first type region 110 and below the second type region 120.

In some embodiments, a first portion 506 of the second type region 120 is disposed above the first type region 110 while a second portion 508 of the second type region 120 is disposed above the second barrier region 504. In some embodiments, the first portion 506 of the second type region 120 is in contact with the first type region 110. In some embodiments, the second portion 508 of the second type region 120 is in contact with the second barrier region 504. In an embodiment, the first portion 506 does not overlap with the second portion 508 of the second type region 120, such that the first portion 506 and second portion 508 are laterally adjacent to one another.

Figure 20:
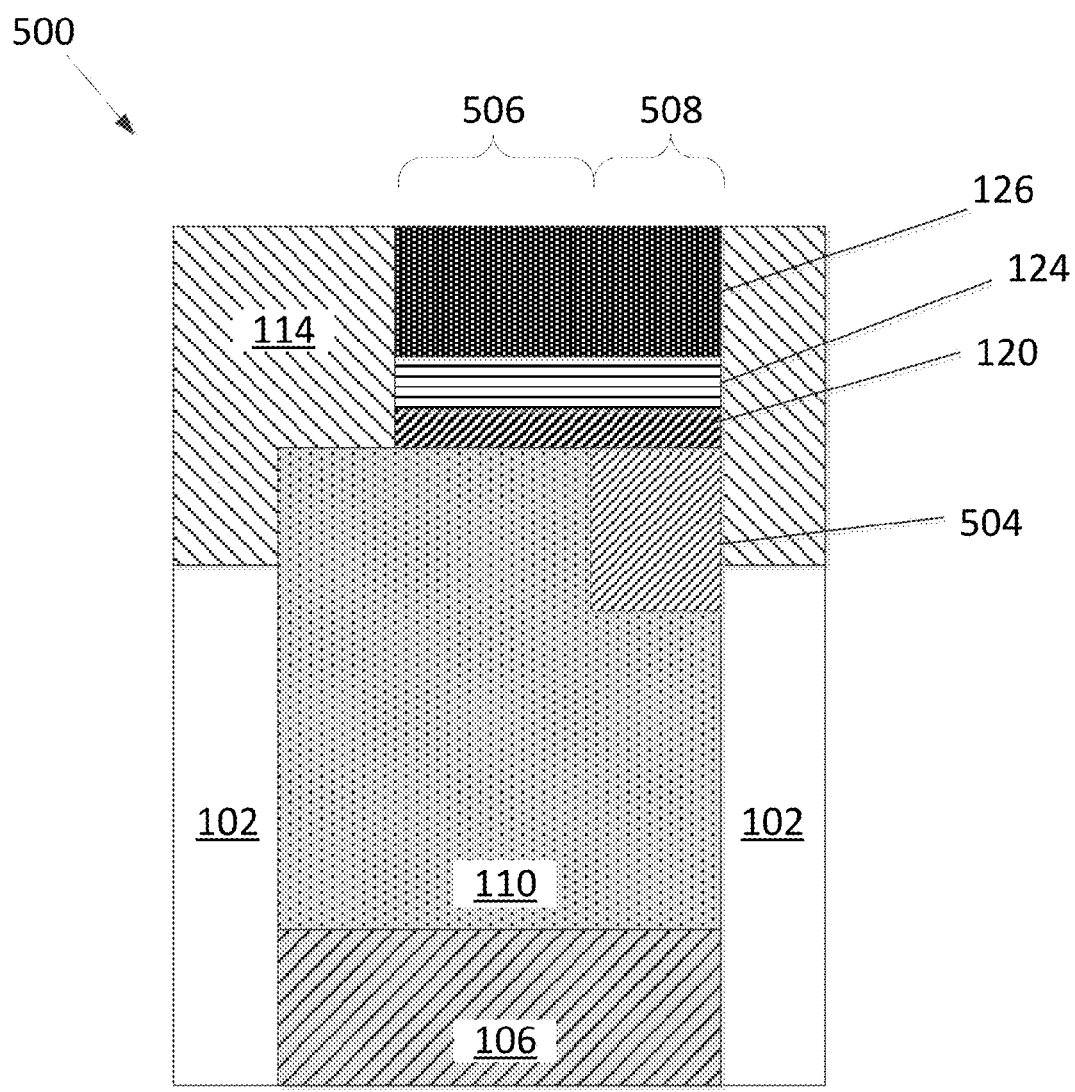
FIG. 20 illustrates a gate insulator and gate electrode associated with a fin tunnel field effect transistor, according to an embodiment.

FIG. 20 illustrates the formation of the gate insulator 124 and gate electrode 126. In an embodiment, the gate insulator 124 and gate electrode 126 are formed within the opening 118. In an embodiment, the gate insulator 124 is disposed above and on top of the second type region 120. In an embodiment, the gate electrode 126 is disposed above and on top of the gate insulator 124. In an embodiment, the first portion 506 of the second type region 120 is disposed below the gate insulator 124. In some embodiments, at least a majority of the second portion 508 of the second type region 120 is not disposed below the gate insulator 124.

Figure 21:
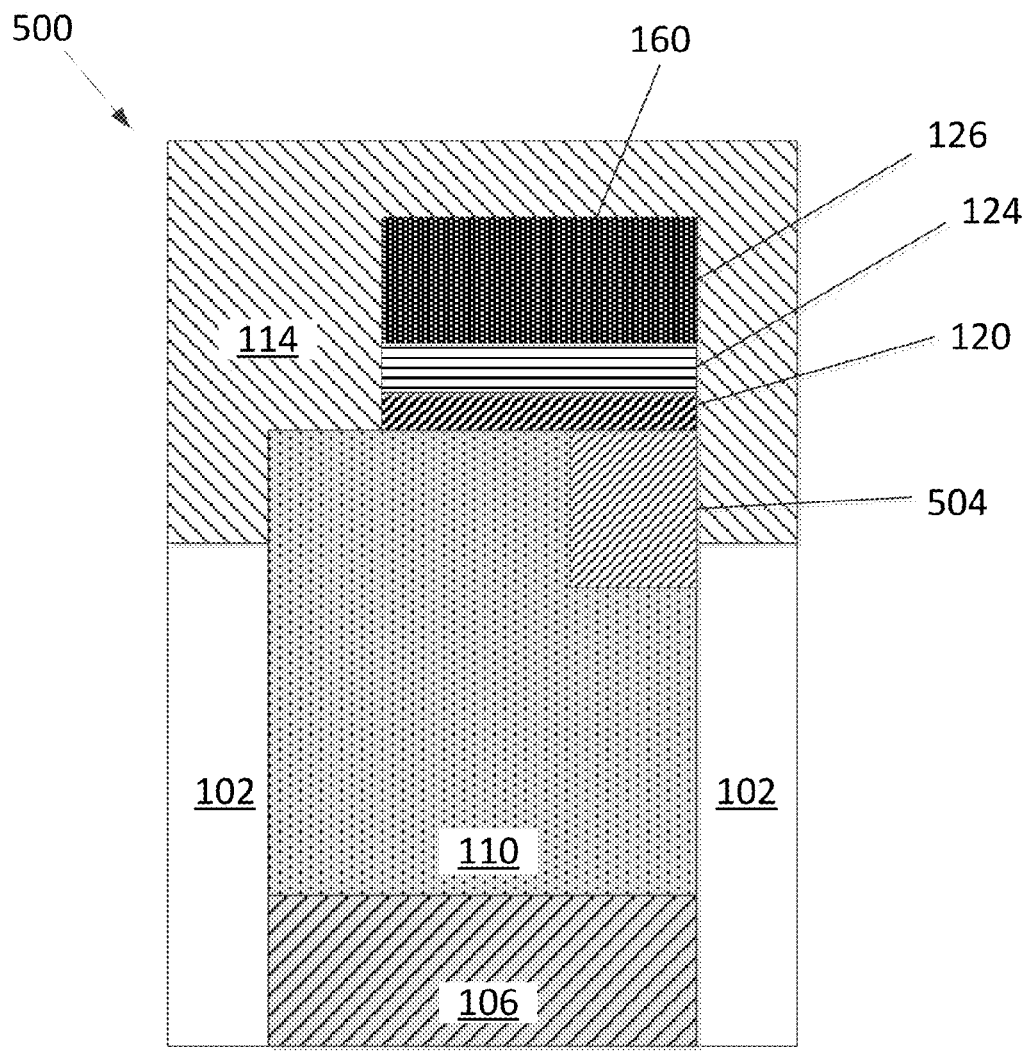
FIG. 21 illustrates masking associated with forming a fin tunnel field effect transistor, according to an embodiment.

FIG. 21 illustrates the formation of the mask layer 114. In an embodiment, the mask layer 114 is formed above the gate electrode 126. According to some embodiments, the mask layer 114 is deposited above the gate electrode 126 and extends across the upper surface 160 of the gate electrode 126 so as to cover the gate electrode 126.

Figure 22:
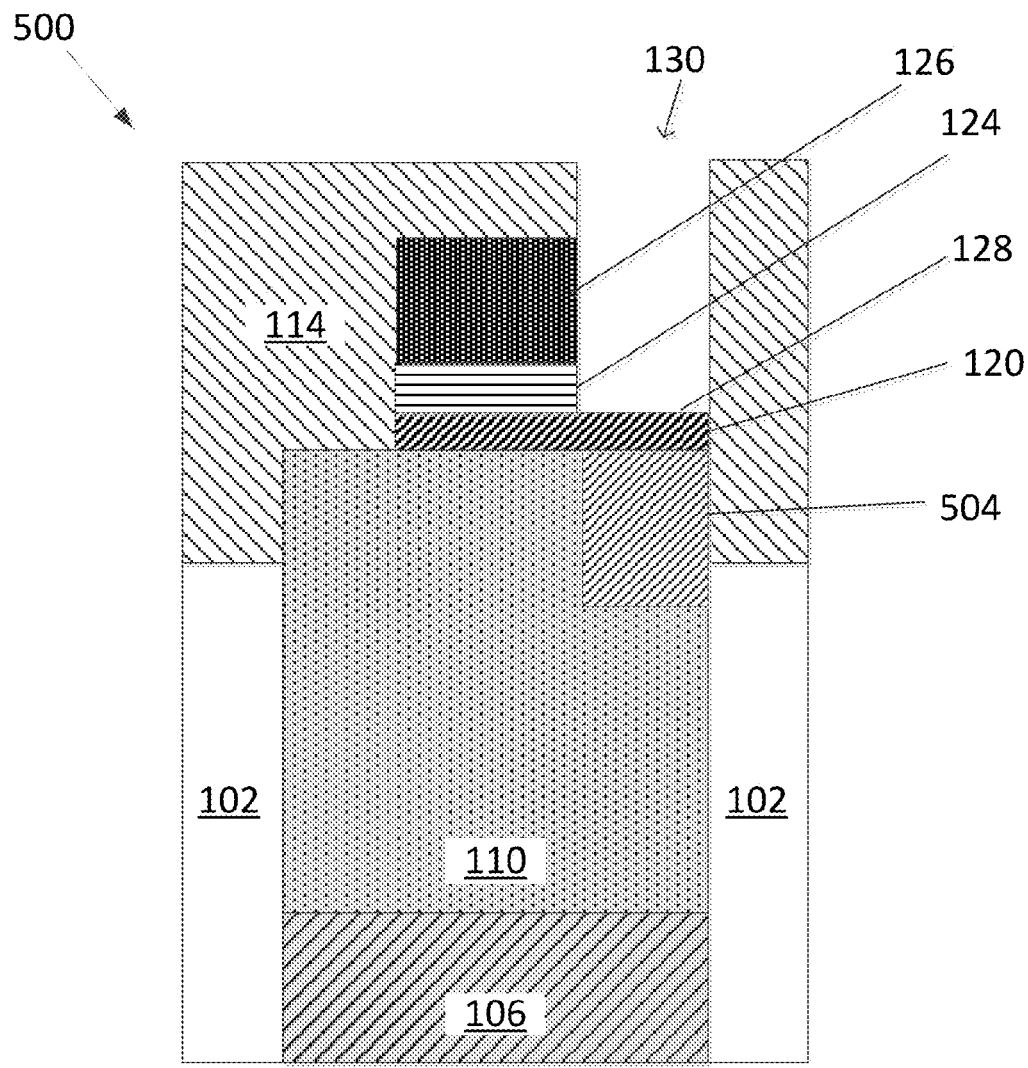
FIG. 22 illustrates forming an opening associated with forming a fin tunnel field effect transistor, according to an embodiment.

FIG. 22 illustrates the formation of the second opening 130. In an embodiment, the second opening 130 is formed in the mask layer 114, gate insulator 124, and gate electrode 126, such as by etching. In some embodiments, the second opening 130 is formed at least partially over the second type region 120 by removing a portion of the mask layer 114, gate insulator 124, and gate electrode 126. In an embodiment, the second opening 130 is formed to the top surface 128 of the second type region 120.

Figure 23:
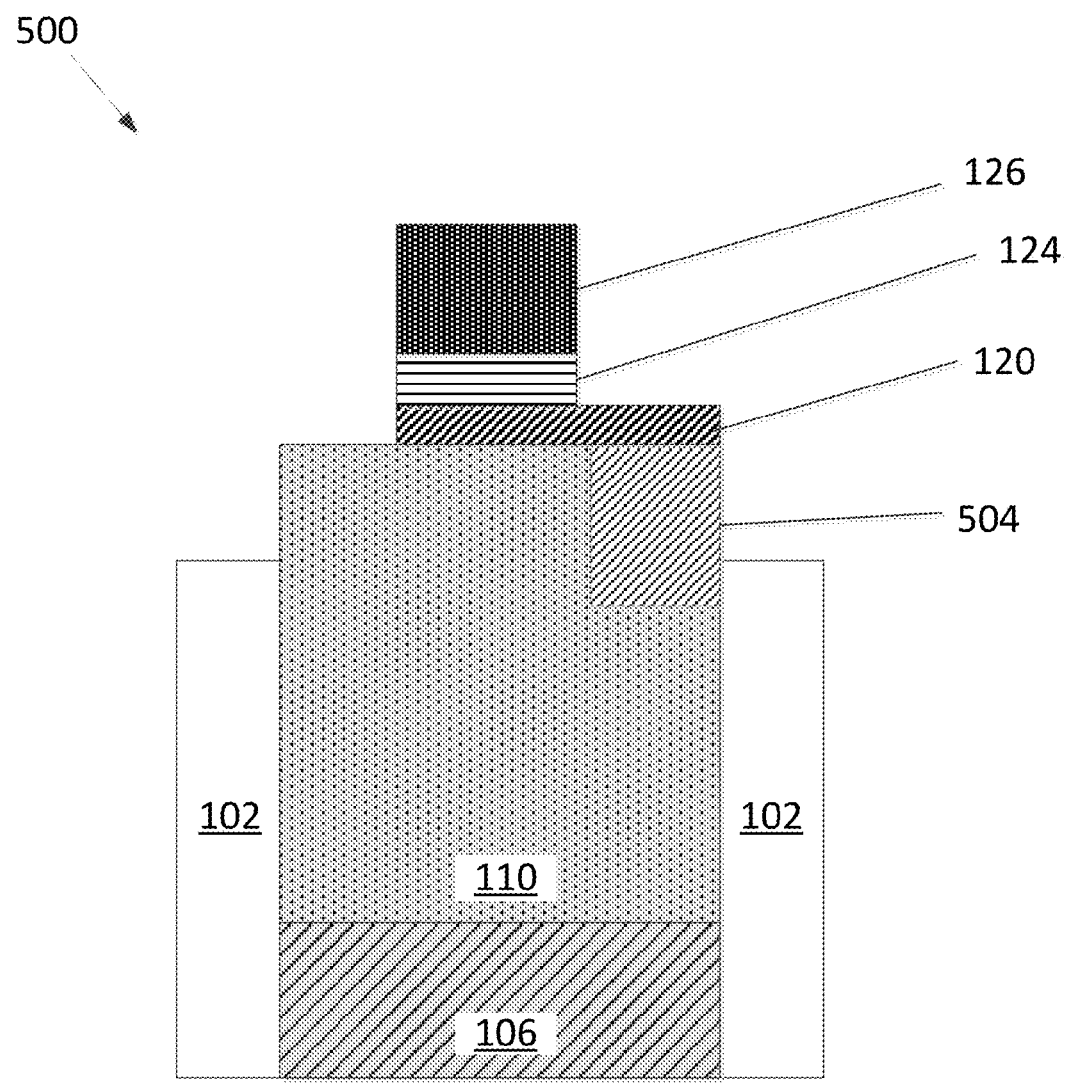
FIG. 23 illustrates removing a mask region associated with forming a fin tunnel field effect transistor, according to an embodiment.

FIG. 23 illustrates the removal of the mask layer 114. In an embodiment, the mask layer 114 is removed after the second opening 130 is formed. The mask layer 114 is removed in any number of ways, such as by etching, for example.

Figure 24:
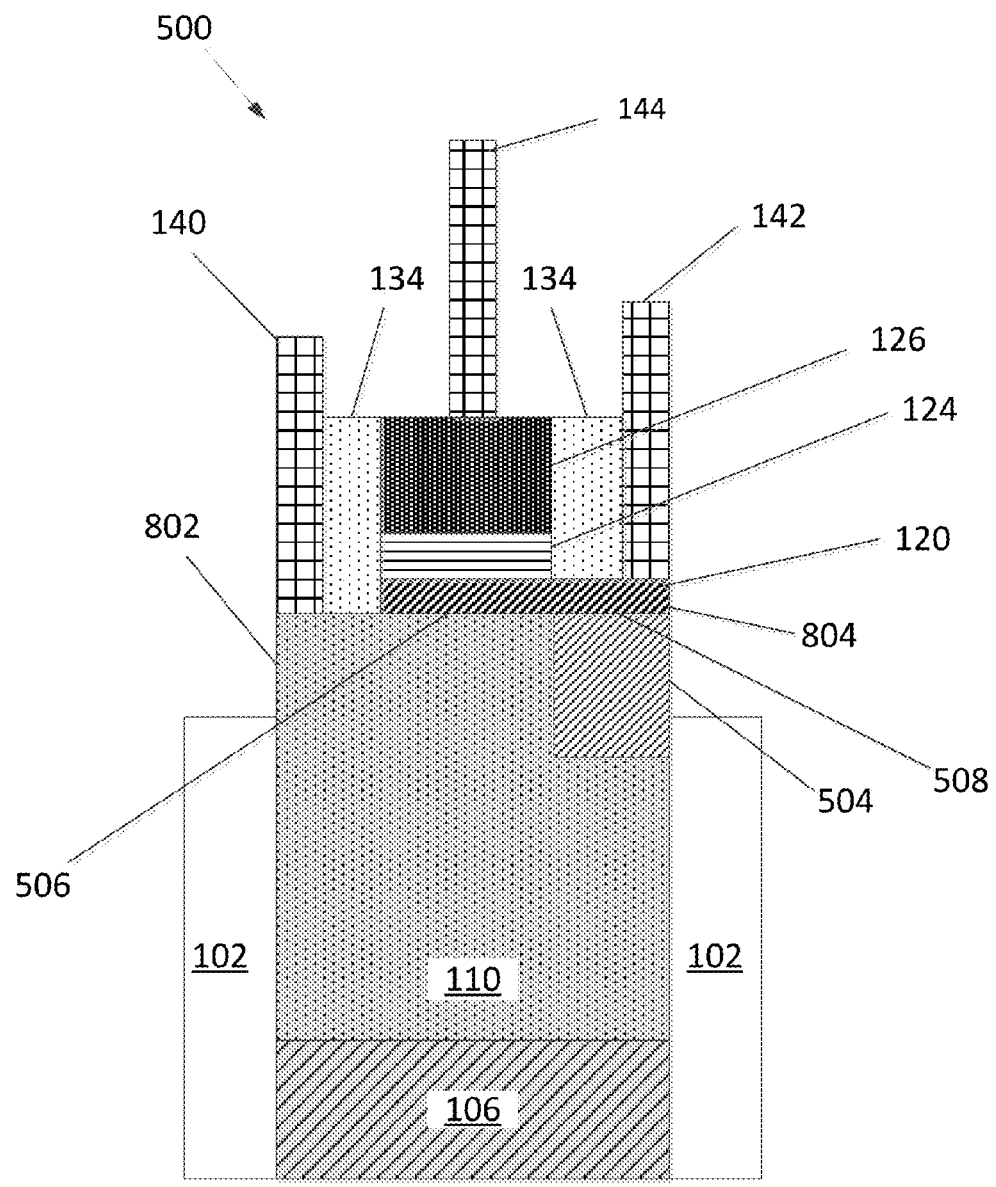
FIG. 24 illustrates a fin tunnel field effect transistor, according to an embodiment.

FIG. 24 is a cross-sectional view illustrating an example of the fifth fin tunnel FET 500. In an embodiment, the fifth fin tunnel FET 500 includes the spacers 134, the source contact 140, drain contact 142, and gate contact 144. The source contact 140 is formed in contact with the first type region 110 while the drain contact 142 is formed in contact with the second type region 120, and the gate contact 144 is formed in contact with the gate electrode 126.

In an embodiment, the fifth fin tunnel FET 500 comprises an n-type FET. In some embodiments, the first type region 110 of the fifth fin tunnel FET 500 comprises gallium anitmonide (GaSb) and is doped with a p-type impurity such that the first type region 110 comprises a p-type material. In some embodiments, the second type region 120 of the fifth fin tunnel FET 500 comprises indium arsenide (InAs) and is doped with an n-type impurity such that the second type region 120 comprises an n-type material. In some embodiments, the first type region 110 comprises the source region 802 while the second type region 120 comprises the drain region 804.

According to some embodiments, when a voltage ($V_g$) is applied to the gate contact 144, current will flow from the source contact 140, through the first type region 110, through the second type region 120, and to the drain contact 142. In an embodiment, the second barrier region 504 promotes current flow within the first portion 506 of the second type region 120 underneath the gate insulator 124 and gate electrode 126. According to some embodiments, current is inhibited from flowing within the second barrier region 504 and thus is instead directed up into the first portion 506 of the second type region 120 prior to traversing the second portion 508 of the second type region 120 before reaching the drain contact 142.

Figure 25:
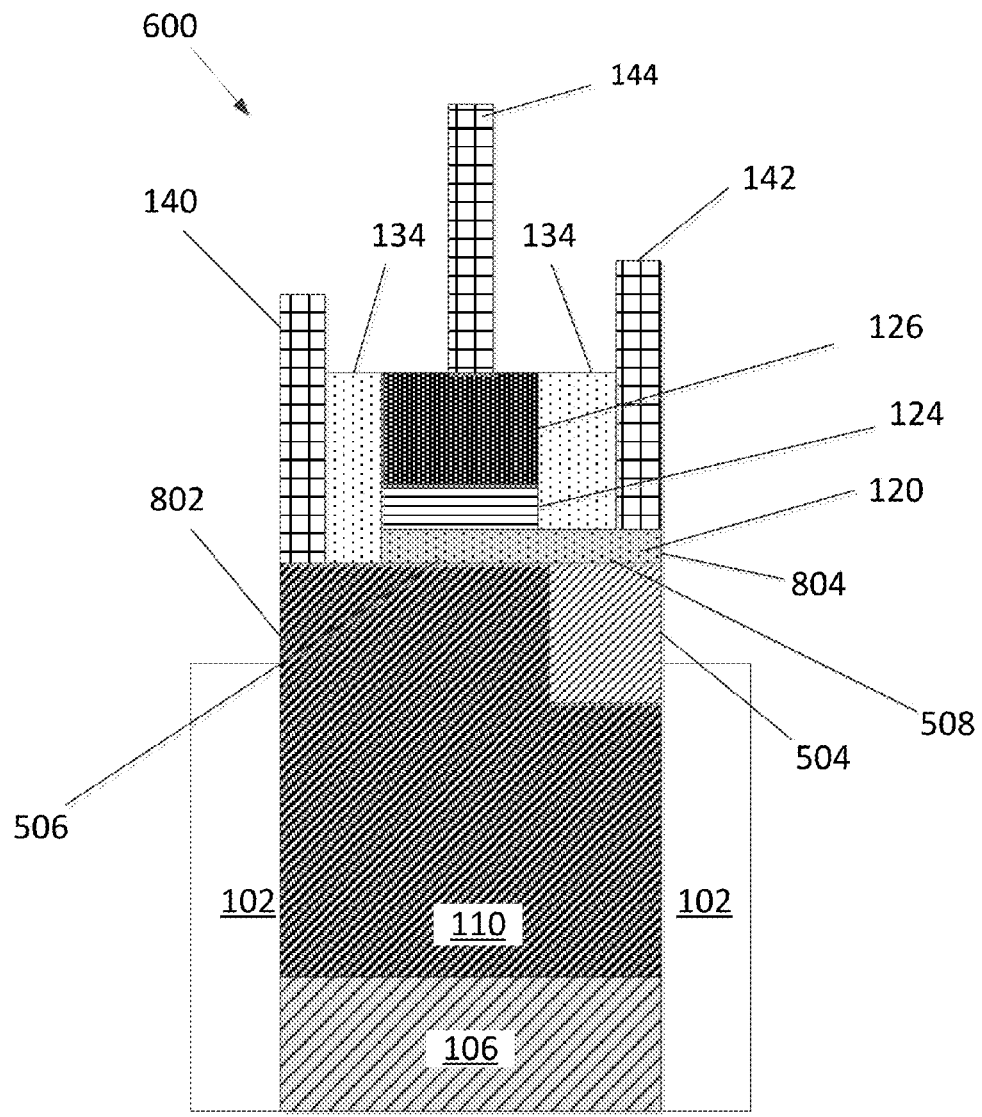
FIG. 25 illustrates a fin tunnel field effect transistor, according to an embodiment.

FIG. 25 is a cross-sectional view illustrating a sixth example fin tunnel FET 600. In some embodiments, the sixth fin tunnel FET 600 includes the STI region 102, the seed region 106, the first type region 110, the second type region 120, the gate insulator 124, the gate electrode 126, the source contact 140, the drain contact 142, the gate contact 144, and the second barrier region 504.

In some embodiments, the sixth fin tunnel FET 600 comprises a p-type FET. In an embodiment, the first type region 110 of the sixth fin tunnel FET 600 comprises indium arsenide (InAs) and is doped with an n-type impurity, such that the first type region 110 comprises an n-type material. In an embodiment, the second type region 120 of the sixth fin tunnel FET 600 comprises gallium anitmonide (GaSb) and is doped with a p-type impurity, such that the second type region 120 comprises a p-type material.

According to some embodiments, a negative bias is applied to the gate contact 144 and to the drain contact 142 while the source contact 140 is grounded. Electron holes will flow from the source contact 140, to the first type region 110, through the first portion 506 of the second type region 120 underneath the gate insulator 124 and gate electrode 126, and to the drain contact 142. In some embodiments, as with the fifth fin tunnel FET 500, the second barrier region 504 of the sixth fin tunnel FET 600 directs electron hole flow through the first portion 506 of the second type region 120 under the gate insulator 124 and gate electrode 126.

Figure 26:
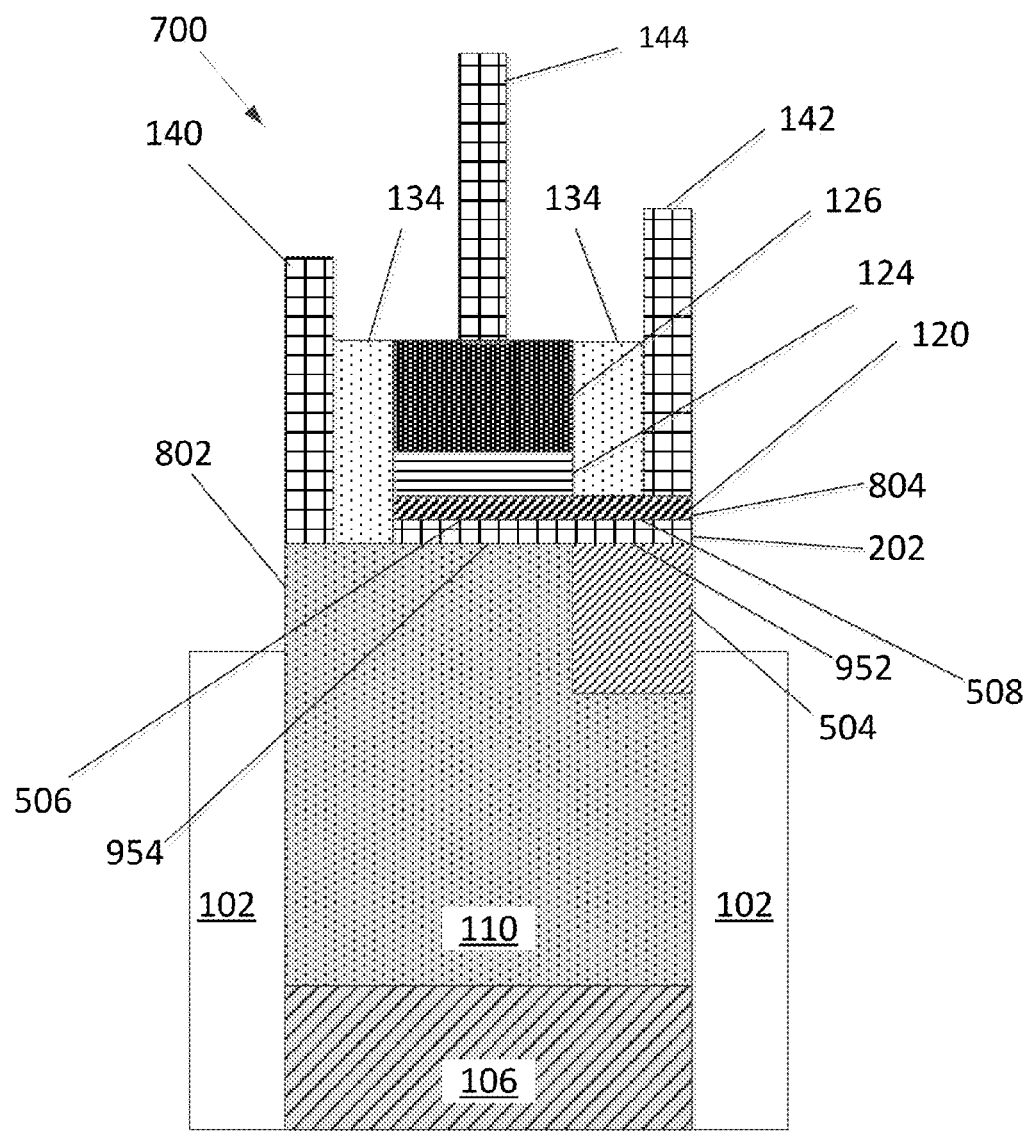
FIG. 26 illustrates a fin tunnel field effect transistor, according to an embodiment.

FIG. 26 is a cross-sectional view illustrating a seventh example fin tunnel FET 700. In an embodiment, the seventh fin tunnel FET 700 includes both the barrier region 202 and the second barrier region 504. In some embodiments, the barrier region 202 and the second barrier region 504 are formed in generally the same way as described above with respect to FIGS. 11 to 25. In an embodiment, the barrier region 202 is disposed above the second barrier region 504 and the first type region 110. In an embodiment, a first portion 952 of the barrier region 202 is in contact with the second barrier region 504. In an embodiment, a second portion 954 of the barrier region 202 is in contact with the first type region 110. An upper surface of the barrier region 202 is in contact with the second type region 120.

In an embodiment, the seventh fin tunnel FET 700 comprises an n-type FET. According to some embodiments, the first type region 110 of the seventh fin tunnel FET 700 comprises gallium anitmonide (GaSb) and is doped with a p-type impurity such that the first type region 110 comprises a p-type material. In some embodiments, the second type region 120 of the seventh fin tunnel FET 700 comprises indium arsenide (InAs) and is doped with an n-type impurity such that the second type region 120 comprises an n-type material.

According to some embodiments, the barrier region 202 inhibits leakage current between the first type region 110 and the second type region 120. In some embodiments, the second barrier region 504 promotes current flow within the first portion 506 of the second type region 120 prior to traversing the second portion 508 of the second type region 120 before reaching the drain contact 142.

Figure 27:
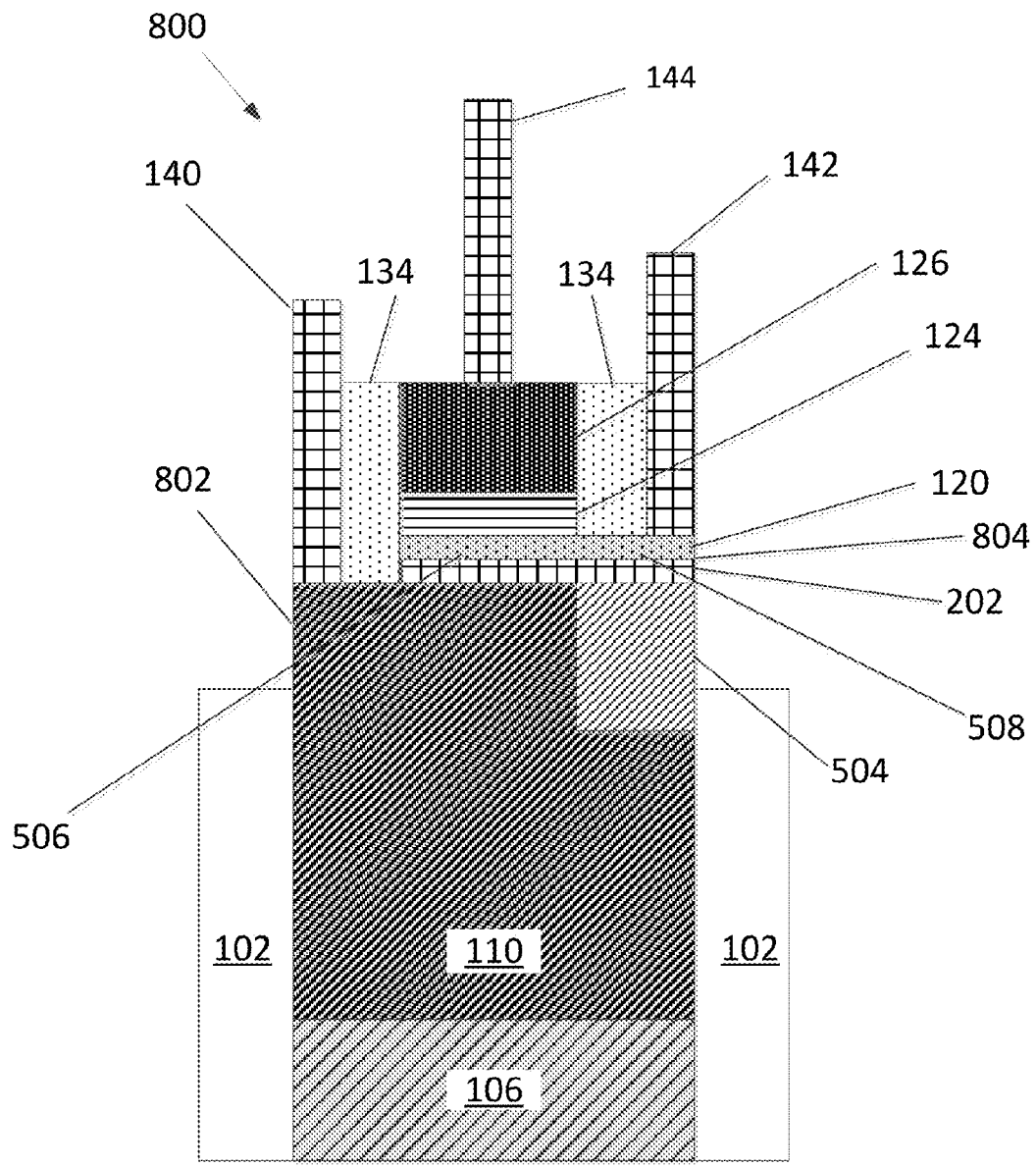
FIG. 27 illustrates a fin tunnel field effect transistor, according to an embodiment.

FIG. 27 is a cross-sectional view illustrating an eighth example fin tunnel FET 800. In an embodiment, the eighth fin tunnel FET 800 includes both the barrier region 202 and the second barrier region 504. In an embodiment, the eighth fin tunnel FET 800 comprises a p-type FET. In an embodiment, the first type region 110 of the eighth fin tunnel FET 800 comprises indium arsenide (InAs) and is doped with an n-type impurity such that the first type region 110 comprises an n-type material. In some embodiments, the second type region 120 of the eighth fin tunnel FET 800 comprises gallium anitmonide (GaSb) and is doped with a p-type impurity such that the second type region 120 comprises a p-type material.

According to some embodiments, at least one of the barrier region 202 or the second barrier region 504 of the eighth fin tunnel FET 800 inhibit leakage current. In an embodiment, in an off state, the barrier region 202 inhibits leakage current between the first type region 110 and the second type region 120. In an embodiment, in an on state, when a negative bias is applied to the gate contact 144 and to the drain contact 142, electron holes will be generally directed by the second barrier region 504 to flow within the first portion 506 of the second type region 120 prior to traversing the second portion 508 of the second type region 120 before reaching the drain contact 142.

Figure 28:
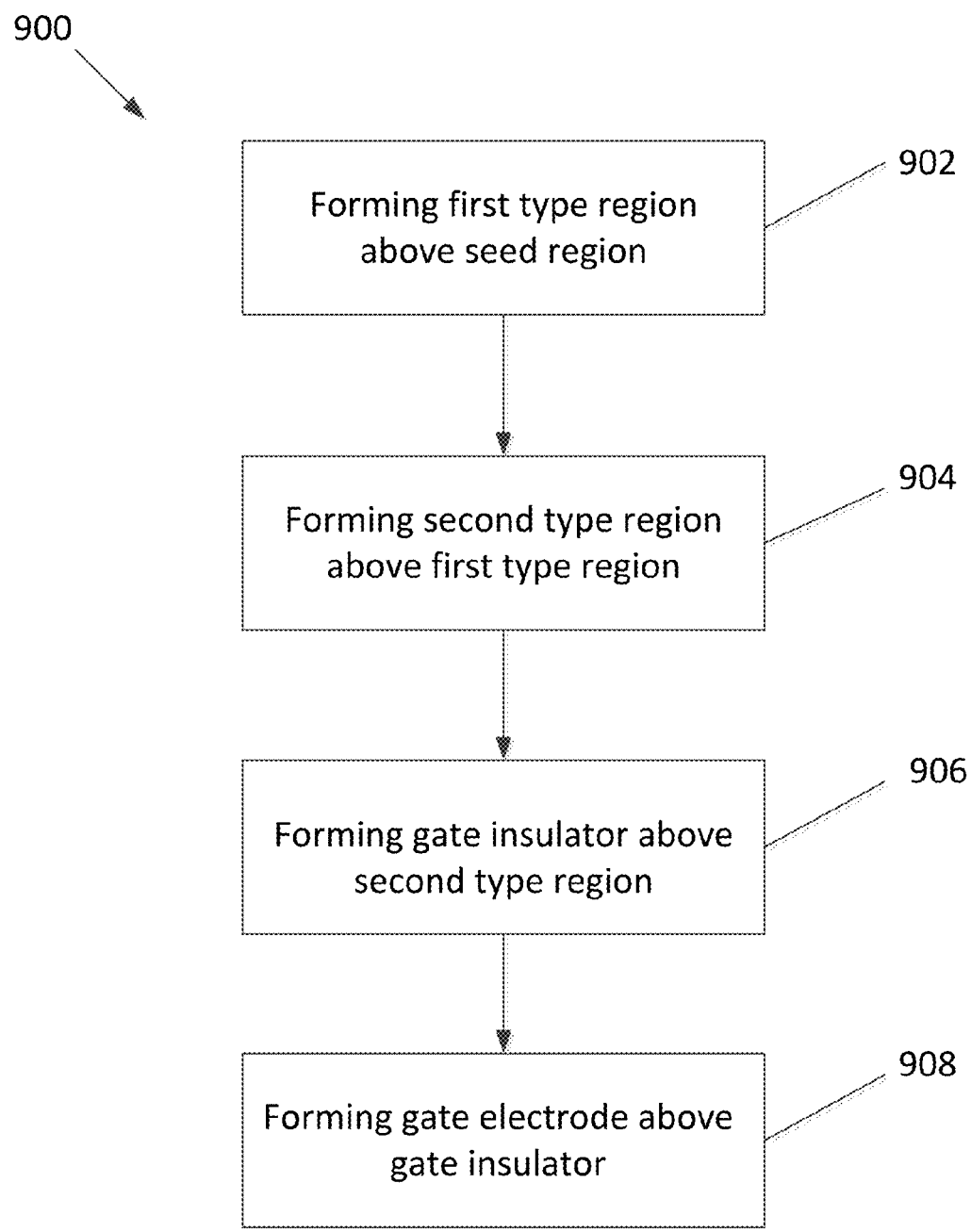
FIG. 28 illustrates a method of forming a fin tunnel field effect transistor, according to an embodiment.

An example method 900 of forming a fin tunnel field effect transistor such as at least one of 100, 200, 300, 400, 500, 600, 700 or 800, according to some embodiments, is illustrated in FIG. 28. At 902, the first type region 110 is formed above the seed region 106. At 904, the second type region 120 is formed above the first type region 110. At 906, the gate insulator 124 is formed above the second type region 120. At 908, the gate electrode 126 is formed above the gate insulator 124.

In an embodiment, a fin tunnel field effect transistor comprises a seed region and a first type region disposed above the seed region. The first type region comprises a first doping. In an embodiment, the fin tunnel field effect transistor comprises a second type region disposed above the first type region. The second type region comprises a second doping that is opposite the first doping. In an embodiment, the fin tunnel field effect transistor comprises a gate insulator disposed above the second type region and a gate electrode disposed above the gate insulator.

In an embodiment, a fin tunnel field effect transistor comprises a seed region and a first type region disposed above the seed region. The first type region comprises a first doping. In an embodiment, the fin tunnel field effect transistor comprises a second type region disposed above the first type region, the second type region comprising a second doping that is opposite the first doping. In an embodiment, the fin tunnel field effect transistor comprises a barrier region disposed below the second type region, a gate insulator disposed above the second type region, and a gate electrode disposed above the gate insulator.

In an embodiment, a method for forming a fin tunnel field effect transistor comprises forming a first type region above a seed region. In an embodiment, the method comprises forming a second type region above the first type region. In an embodiment, the method comprises forming a gate insulator above the second type region. In an embodiment, the method comprises forming a gate electrode above the gate insulator.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A fin tunnel field effect transistor, comprising:
    a seed region;
    a first type region disposed above the seed region, the first type region comprising a first doping;
    a second type region disposed above the first type region, the second type region comprising a second doping that is opposite the first doping;
    a barrier region;
    a gate insulator disposed above the second type region; and
    a gate electrode disposed above the gate insulator, wherein:
        a first portion of the second type region is disposed above and in contact with a top surface of the first type region; and
        a second portion of the second type region is disposed above and in contact with the barrier region.

2. The fin tunnel field effect transistor of claim 1, comprising:

a first spacer disposed above the first type region, wherein the first spacer is in contact with the top surface of the first type region and a sidewall of the second type region.

3. The fin tunnel field effect transistor of claim 2, comprising:
a second spacer disposed above the second type region, wherein the second spacer is in contact with a top surface of the second type region.

4. The fin tunnel field effect transistor of claim 1, comprising:
a contact disposed above the barrier region and in contact with the second type region.

5. The fin tunnel field effect transistor of claim 1, wherein the barrier region is in contact with a sidewall of the first type region and a second top surface of the first type region.

6. The fin tunnel field effect transistor of claim 1, wherein the first portion of the second type region is in contact with the gate insulator.

7. The fin tunnel field effect transistor of claim 1, wherein the barrier region comprises aluminum gallium antimonide (AlGaSb) or aluminum arsenide antimonide (AlAsSb).

\* \* \* \* \*